United States Patent
Ono et al.

(10) Patent No.: US 7,043,269 B2
(45) Date of Patent: May 9, 2006

(54) COMMUNICATION CARD AND COMMUNICATION DEVICE

(75) Inventors: Yasushi Ono, Saijo (JP); Hideki Kirino, Kagawa (JP); Munehiro Shinabe, Niihama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 533 days.

(21) Appl. No.: 10/258,168

(22) PCT Filed: Feb. 26, 2002

(86) PCT No.: PCT/JP02/01735

§ 371 (c)(1),
(2), (4) Date: Oct. 22, 2002

(87) PCT Pub. No.: WO02/069122

PCT Pub. Date: Sep. 6, 2002

(65) Prior Publication Data

US 2003/0144031 A1    Jul. 31, 2003

(30) Foreign Application Priority Data

Feb. 26, 2001  (JP) .............................. 2001-50636

(51) Int. Cl.
*H04B 1/38* (2006.01)
*H04M 1/00* (2006.01)

(52) U.S. Cl. ..................... 455/558; 455/557; 455/41.1; 455/80; 455/83; 455/85; 340/572.1; 340/572.7

(58) Field of Classification Search .............. 455/41.1, 455/41.2, 557, 558, 556.1, 556.2, 90.1; 340/572.1, 340/572.7; 342/357.09, 357.1
See application file for complete search history.

(56) References Cited

U.S. PATENT DOCUMENTS

| | | | | |
|---|---|---|---|---|
| 5,606,732 A | * | 2/1997 | Vignone, Sr. | ................ 455/269 |
| 5,684,672 A | * | 11/1997 | Karidis et al. | .............. 361/683 |
| 5,828,346 A | * | 10/1998 | Park | .......................... 343/826 |
| 5,867,131 A | * | 2/1999 | Camp et al. | ................. 343/797 |
| 5,913,174 A | * | 6/1999 | Casarez et al. | ............. 455/557 |
| 5,978,655 A | * | 11/1999 | Ohura et al. | ................ 455/41.1 |
| 6,137,447 A | * | 10/2000 | Saitoh et al. | ............... 343/742 |
| 6,145,748 A | * | 11/2000 | Neifer et al. | ................ 235/486 |
| 6,166,701 A | * | 12/2000 | Park et al. | ................... 343/771 |
| 6,181,284 B1 | * | 1/2001 | Madsen et al. | ............. 343/702 |

(Continued)

FOREIGN PATENT DOCUMENTS

CN           1052975           7/1991

(Continued)

*Primary Examiner*—Marceau Milord
(74) *Attorney, Agent, or Firm*—Wenderoth, Lind & Ponack, L.L.P.

(57) ABSTRACT

A communication card or communication device is provided that includes an antenna for transmitting/receiving communication waves; a variable matching unit which can vary a circuit parameter; a directional coupling unit for extracting a reflected signal from the antenna; a detection unit for extracting the amplitude of the reflected signal; a control unit for outputting a control signal; an amplifier for amplifying a high frequency signal at a RF band; a frequency converter for converting an IF band signal into a RF band signal or a RF band signal into an IF band signal; a modulator/demodulator for modulating an IF signal to obtain a baseband signal at the transmission and demodulating an IF signal to obtain a baseband signal at the receiving; a baseband processor for processing the baseband signal; and a card interface for exchanging data with an information device.

26 Claims, 12 Drawing Sheets

U.S. PATENT DOCUMENTS

| | | | |
|---|---|---|---|
| 6,240,302 B1 * | 5/2001 | Harrison | 455/556.1 |
| 6,278,864 B1 * | 8/2001 | Cummins et al. | 455/73 |
| 6,456,245 B1 * | 9/2002 | Crawford | 343/702 |
| 6,522,299 B1 * | 2/2003 | Beard et al. | 343/702 |
| 6,594,506 B1 * | 7/2003 | Vapaakoski et al. | 455/557 |
| 6,690,949 B1 * | 2/2004 | Shamlou et al. | 455/557 |
| 6,792,256 B1 * | 9/2004 | Kinney et al. | 455/277.1 |

FOREIGN PATENT DOCUMENTS

| | | |
|---|---|---|
| CN | 1179657 | 4/1998 |
| EP | 0741463 A2 | 11/1996 |
| JP | 6-224618 | 8/1994 |
| JP | 9-69799 | 3/1997 |
| JP | 09-069799 | 3/1997 |
| JP | 10-098423 | 4/1998 |
| JP | 11-205184 | 7/1999 |
| JP | 11-251956 | 9/1999 |
| JP | 2000-010681 | 1/2000 |
| JP | 2000-10681 | 1/2000 |
| JP | 2000-163169 | 6/2000 |
| JP | 2000-163170 | 6/2000 |
| KR | 1998-009784 | 4/1998 |

* cited by examiner

COMMUNICATION CARD AND COMMUNICATION DEVICE

TECHNICAL FIELD

The present invention relates to a communication card and a communication device and, more particularly, to a communication card and a communication device which are attached to an information device to perform radio information transmission.

BACKGROUND ART

In recent years, with the widespread use of mobile phones, interests in personal mobile communication are increasingly developing. Accordingly, forms in which a card-shaped communication card is attached to an already-spread information device having a card slot, such as notebook personal computers, personal digital assistances (PDA) and digital cameras, are suggested, and various communication cards are provided for that purpose.

FIG. 16 is a diagram schematically showing a usage form of a conventional communication card. A communication card 1102 is constituted by a connector portion 1104, a card portion 1105, and an antenna portion 1106.

In FIG. 16, the communication card 1102 is inserted into a card slot 1103 of an information device 1101, and then the connector portion 1104 of the communication card abuts a connector of the information device, thereby being attached thereto. Here, the communication card 1102 is housed in the card slot 1103 from the side of the connector portion 1104 up to the boundary area between the card portion 1105 and the antenna portion 1106. The antenna portion 1106 protrudes from the card slot 1103 so as not to deteriorate the antenna capability.

Further, FIG. 17 is a block diagram illustrating a communication card.

As shown in FIG. 17, a communication card is constituted by a transmitting/receiving antenna 1107 for transmitting/receiving communication waves, an amplifier 1108 for amplifying a signal, a frequency converter 1109 for converting a frequency of an inputted signal, a modulator/demodulator 1110 for demodulating a received signal or modulating a signal to be transmitted, a baseband processor 1111 for processing a baseband signal, and a card interface 1112 for communicating data with an information device.

When the communication card 1102 receives communication waves, a received signal flows in a following order: received signal (radio waves)→the transmitting/receiving antenna 1107 (operating as a receiving antenna at the receiving)→the amplifier 1108→the frequency converter 1109→the modulator/demodulator 1110 (operating as a demodulator at the receiving)→the baseband processor 1111 the card interface 1112. When a signal is transmitted from the communication card 1102, the signal to be transmitted flows in a following order: the card interface 1112→the baseband processor 1111→the modulator/demodulator 1110 (operating as a modulator at the transmission)→the frequency converter 1109→the amplifier 1108→the transmitting/receiving antenna 1107 (operating as a transmitting antenna at the transmission)→the signal to be transmitted (radio waves).

However, this communication card 1102 has such a construction that the antenna portion 1106 protrudes from the body of the information device 1101 when the communication card 1102 is inserted into the information device 1101. Thus, when the information device 1101 is carried out with the communication card 1102 being attached thereto, the antenna portion 1106 protruding from the body is put in an easily touched state, thereby having a risk of breakage, and further becomes an obstacle when carried out.

To prevent the protruding part from being an obstacle, there has been conceived that the antenna portion 1106 is miniaturized as a part of the card portion 1105 to decrease the protrusion from the body. However, with the above-mentioned construction of the conventional communication card 1102, when the protrusion from the body is decreased, the metallic body of the information device 1101 and the antenna electromagnetically couple with each other, thereby deteriorating the antenna characteristics, resulting in a degradation of the communication functions. Further, while the communication card 1102 is generally employed being replaceably inserted into various information devices 1101, the degrees of the electromagnetic coupling between the information device 1101 and the communication card 1102 vary with the information devices 1101 to be used, so that the degree of the coupling cannot be predicated in advance, which makes the solution of the problems more difficult.

Further, to make the antenna portion 1106 harder to be broken, a solution in which the connection between the antenna portion 1106 and the card portion 1105 is made solid, and a solution in which the antenna portion 1106 is enabled to be detached using a high frequency connector are examined. However, when these solutions are performed, manufacturing costs for the communication card 1102 are unfavorably increased.

The present invention is made to solve the above-mentioned problems, and has for its object to provide a communication card and a communication device which can prevent the breakage of the antenna portion and the deterioration of the antenna characteristics, and further can suppress increases in the manufacturing costs.

SUMMARY OF THE INVENTION

According to a first aspect of the present invention there is provided a communication card as a card-shaped communication device that is used being inserted into a card slot of an information device, and this communication card includes: an antenna for receiving or outputting communication waves; and an antenna matching means for establishing a conjugate match between an input impedance of the antenna and an output impedance of a matching circuit so as to have resistances which are equal to each other and reactances which have opposite signs but equal absolute values, in which the antenna is placed to be electromagnetically coupled with a metallic body which constitutes the information device, via an internal wall of the card slot, and the antenna matching means varies a circuit parameter as well as detects a reflected signal from the antenna at transmission and decides the circuit parameter such that the reflected signal has a minimum amplitude at receiving.

The communication card that is constructed as described above positively uses the electromagnetic coupling between the metallic body of the information device and the antenna, which has conventionally been a problem, and further prevents deterioration of the antenna characteristics by using an automatic matching function. Therefore, even when a protrusion of the antenna part is reduced in uses where the communication card is replaceably inserted into plural information devices and further the information device is carried out with the communication card being inserted thereto, the communication card can retain satisfactory communication characteristics.

According to a second aspect of the present invention, in the communication card of the first aspect, the antenna matching means includes: a variable matching unit which can vary the circuit parameter in accordance with a control signal; a directional coupling unit for extracting the reflected signal from the antenna; a detection unit for detecting the amplitude of the reflected signal that is extracted by the directional coupling unit; and a control unit for outputting the control signal to the variable matching unit on the basis of the amplitude of the reflected signal that is detected by the detection unit.

The communication card that is constructed as described above positively uses the electromagnetic coupling between the metallic body of the information device and the antenna, which has conventionally been a problem, and further prevents deterioration of the antenna characteristics by using an automatic matching function. Therefore, even when a protrusion of the antenna part is reduced in uses where the communication card is replaceably inserted into plural information devices and further the information device is carried out with the communication card being inserted thereto, the communication card can retain satisfactory communication characteristics.

According to a third aspect of the present invention, in the communication card of the second aspect, the directional coupling unit includes: two microstrip lines each having a length corresponding to a ¼ wavelength; two coupling resistors; and one end resistor, and both ends of the two microstrip lines are connected with each other by the two coupling resistors, respectively, as well as an end of one of the two microstrip lines and a grounding conductor are connected by the end resistor.

The communication card that is constructed as described above positively uses the electromagnetic coupling between the metallic body of the information device and the antenna, which has conventionally been a problem, and further prevents deterioration of the antenna characteristics by using an automatic matching function. Therefore, even when a protrusion of the antenna part is reduced in uses where the communication card is replaceably inserted into plural information devices and further the information device is carried out with the communication card being inserted thereto, the communication card can retain satisfactory communication characteristics.

According to a fourth aspect of the present invention, in the communication card of the second aspect, the variable matching unit includes: plural capacitors and coils; first switches for making effective an arbitrary capacitor and coil among the plural capacitors and coils; and a first switch selector for controlling the first switches.

The communication card that is constructed as described above positively uses the electromagnetic coupling between the metallic body of the information device and the antenna, which has conventionally been a problem, and further prevents deterioration of the antenna characteristics by using an automatic matching function. Therefore, even when a protrusion of the antenna part is reduced in uses where the communication card is replaceably inserted into plural information devices and further the information device is carried out with the communication card being inserted thereto, the communication card can retain satisfactory communication characteristics.

According to a fifth aspect of the present invention, in the communication card of the second aspect, the variable matching unit includes one microstrip line, plural capacitors, first switches for making effective an arbitrary capacitor among the plural capacitors, and a first switch selector for controlling the first switches.

The communication card that is constructed as described above can realize a control function of the communication card that retains satisfactory communication characteristics with fewer components and a smaller increase in costs.

According to a sixth aspect of the present invention, in the communication card of the fifth aspect, the plural capacitors included in the variable matching unit are connected to the microstrip line and a grounding conductor at predetermined intervals on the microstrip line, and the microstrip line is connected between an input terminal of the antenna and an input terminal of the variable matching unit.

The communication card that is constructed as described above can realize a control function of the communication card that retains satisfactory communication characteristics with fewer components and a smaller increase in the costs.

According to a seventh aspect of the present invention, in the communication card of the second aspect, the control unit carries out: a first step of extracting the reflected signal from the antenna; a second step of deciding the circuit parameter of the variable matching unit according to the amplitude of the reflected signal that is extracted in the first step; and a third step of generating the control signal on the basis of the circuit parameter that is decided in the second step, repeatedly in this order.

The communication card that is constructed as described above can realize a control function of the communication card that retains satisfactory communication characteristics with fewer components and a smaller increase in the costs.

According to an eighth aspect of the present invention, in the communication card of the seventh aspect, in the second step, one of a matching executing routine for executing matching of the antenna and a matching monitoring routine for monitoring matching of the antenna is selected, and the selected routine is executed so that, in the matching executing routine, random circuit parameters are generated to decide a circuit parameter at which the reflected signal from the antenna is minimized and, in the matching monitoring routine, start of the conjugate match is decided when a deterioration degree of the conjugate match exceeds a threshold from viewpoints of a level and time.

The communication card that is constructed as described above can realize a control function of the communication card that retains satisfactory communication characteristics with fewer components and a smaller increase in the costs.

According to a ninth aspect of the present invention, in the communication card of the second aspect, the variable matching unit includes: one microstrip line; two varactor diodes; two variable voltage devices generating voltages which are to be applied to the two varactor diodes; two capacitors; two coils; and two resistors.

The communication card that is constructed as described above can realize a control function of the communication card that retains satisfactory communication characteristics with fewer components and a smaller increase in the costs.

According to a tenth aspect of the present invention, in the communication card of the ninth aspect, the capacitors, the coils, and the varactor diodes are connected in series between both ends of the microstrip line included in the variable matching unit, and grounding conductors, respectively, and the resistors and the variable power supplies are connected in series between connections of the coils and the varactor diodes which are connected in series, and grounding conductors, respectively.

The communication card that is constructed as described above can realize a control function of the communication card that retains satisfactory communication characteristics with fewer components and a smaller increase in the costs.

According to an eleventh aspect of the present invention, in the communication card of the second aspect, the variable matching unit includes a variable phase shifter which can vary a phase amount of a signal that passes through the shifter itself.

The communication card that is constructed as described above can realize a control function of the communication card that retains satisfactory communication characteristics with fewer components and a smaller increase in the costs.

According to a twelfth aspect of the present invention, in the communication card of the eleventh aspect, assuming that the variable matching unit employs two of the variable phase shifter, and one of the variable phase shifters is a first variable phase shifter and the other is a second variable phase shifter, the first variable phase shifter is connected between an input terminal of the antenna and an input terminal of the variable matching unit, and the second variable phase shifter is connected between the input terminal of the variable matching unit and a grounding conductor.

The communication card that is constructed as described above can realize a control function of the communication card that retains satisfactory communication characteristics with fewer components and a smaller increase in the costs.

According to a thirteenth aspect of the present invention, in the communication card of the twelfth aspect, the variable phase shifter is a voltage variable phase shifter in which passed phase amounts vary with voltages, and includes a variable power supply that generates a voltage that is applied to the voltage variable phase shifter.

The communication card that is constructed as described above can realize a control function of the communication card that retains satisfactory communication characteristics with fewer components and a smaller increase in the costs.

According to a fourteenth aspect of the present invention, in the communication card of the eleventh aspect, the variable phase shifter includes: one hybrid coupler that uses a microstrip line; and two varactor diodes.

The communication card that is constructed as described above can realize a control function of the communication card that retains satisfactory communication characteristics with fewer components and a smaller increase in the costs.

According to a fifteenth aspect of the present invention, in the communication card of the eleventh aspect, plural antennas having different polarized waves are included as the antenna, and a selectively switching means for selecting one of the plural antennas.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to a sixteenth aspect of the present invention, the communication card of the fifteenth aspect includes an antenna switch as the selectively switching means.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to a seventeenth aspect of the present invention, in the communication card of the fifteenth aspect, the plural antennas having different polarized waves are two rectangular loop antennas which employ lines of a printed board.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to an eighteenth aspect of the present invention, in the communication card of the fifteenth aspect, the plural antennas having different polarized waves are antennas which generate two elliptical polarized waves having opposite rotations.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to a nineteenth aspect of the present invention, in the communication card of the fifteenth aspect, the plural antennas having different polarized waves are two dipole antennas which are placed orthogonally with each other.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to a twentieth aspect of the present invention, in the communication card of the fifteenth aspect, the plural antennas having different polarized waves include: lines of a printed board; a folded conductor plate; and a PIN diode switch.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to a twenty-first aspect of the present invention, in the communication card of the fifteenth aspect, the plural antennas having different polarized waves generate three electric fields having different polarized waves by controlling electric fields which are generated by a waveguide antenna and a ½-wavelength linear antenna.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to a twenty-second aspect of the present invention, in the communication card of any of the fifteenth, sixteenth and twenty-first aspects, the plural antennas having different polarized waves include: a waveguide antenna that is constituted by lines of a printed board and a folded conductor plate; and one linear antenna having a length corresponding to a ½ wavelength in the vicinity of an opening surface of the waveguide antenna, and the linear antenna is placed so as to generate an electric field that is perpendicular to an electric field which is generated by the waveguide antenna, as well as an opening wall of the waveguide antenna and the linear antenna are connected via a switch.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to a twenty-third aspect of the present invention, in the communication card of the fifteenth aspect, an antenna switch button as the selectively switching means is provided on an end surface of the communication card, and one of the plural antennas having different polarized waves is selected when the switch button is pushed.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to a twenty-fourth aspect of the present invention, in the communication card of the fifteenth aspect, one of the plural antennas having different polarized waves is selected by software included in an information device that is capable of using the communication card.

The communication card that is constructed as described above can realize an antenna of the communication card that retains satisfactory communication characteristics with fewer components and a smaller increase in the costs, as well as this antenna equivalently constituting plural antennas having different polarized waves together with the metallic body of the information device, whereby an optimum antenna can be selected according to the state of the waves.

According to a twenty-fifth aspect of the present invention, there is provided a communication device that is used being attached to a connector of an information device, and this information device includes: an antenna for receiving or outputting communication waves; an antenna matching means for establishing a conjugate match between an input impedance of the antenna and an output impedance of a matching circuit so as to have resistances which are equal to each other and reactances which have opposite sings but equal absolute values, in which the antenna is placed to be electromagnetically coupled with a metallic body which constitutes the information device, and the antenna matching means varies a circuit parameter as well as detects a reflected signal from the antenna at transmission, and decides the circuit parameter such that the reflected signal has a minimum amplitude at the receiving.

The communication device that is constructed as described above positively uses the electromagnetic coupling between the metallic body of the information device and the antenna, which has conventionally been a problem, and further prevents deterioration of the antenna characteristics by using an automatic matching function. Therefore, even when a protrusion of the antenna part is reduced in uses where the communication device is replaceably inserted into plural information devices and further the information device is carried out with the communication device being inserted thereto, the communication device can retain satisfactory communication characteristics.

DETAILED DESCRIPTION OF THE INVENTION

Hereinafter, embodiments of the present invention will be described with reference to the drawings. The embodiments described here are only for illustration, and the present invention is not limited to these embodiments. Before explaining the embodiments, concepts of antenna matching and a circuit parameter will be described. Antenna matching refers to conjugately matching input impedance of an antenna with output impedance of the matching circuit seen from an antenna connection terminal. The conjugate match refers to the input impedance of the antenna and the output impedance of the matching circuit having resistances which are equal to each other, and reactances which have opposite signs but the same absolute value. The circuit parameter is, for example, a voltage value at a time when the matching can be made by immittance of a varactor diode which varies according to the voltage supplied to the varactor diode.

EMBODIMENT 1

A communication card that is defined in claims 1 to 8, 15 to 18, 23, and 24 will be described as a first embodiment of the present invention with reference to the drawings.

Figure 1:
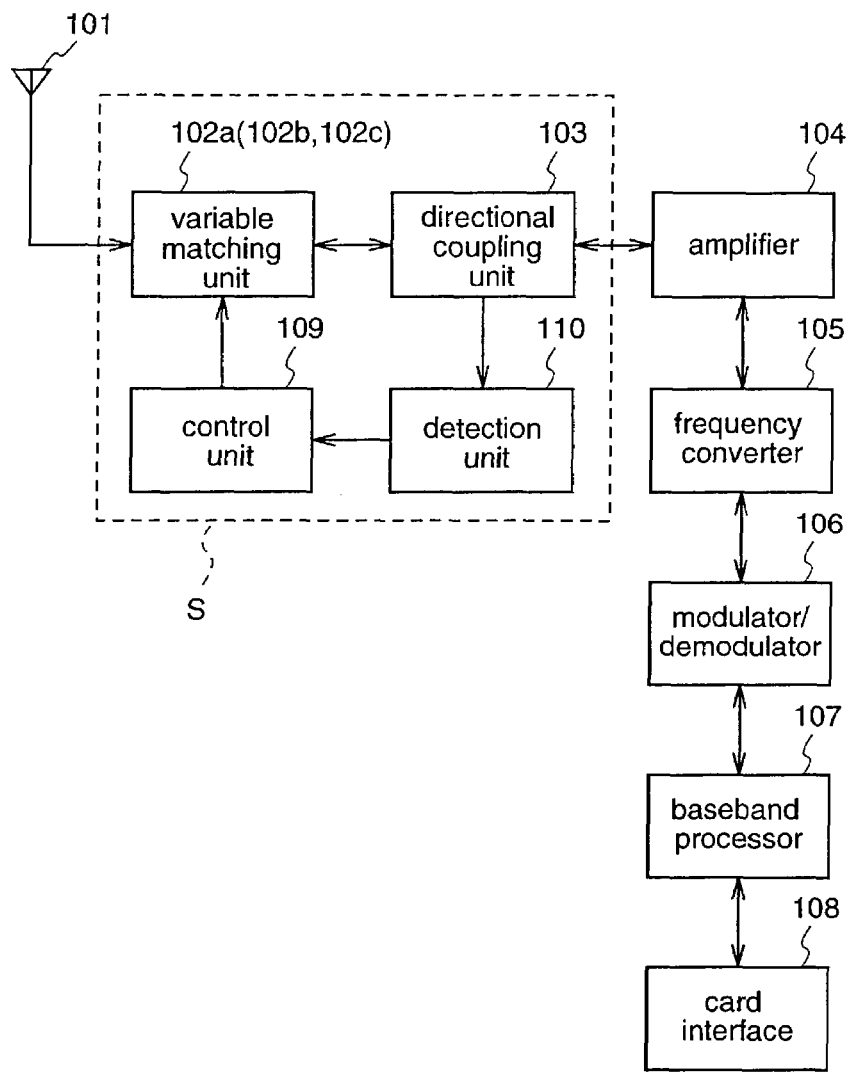
FIG. 1 is a block diagram illustrating a communication card according to a first embodiment of the present invention.

A communication card according to the first embodiment, as a card-shaped communication device that is used for an information device having a card slot, being inserted into the card slot, includes an antenna 101 for receiving or outputting communication waves, and an antenna matching means S for conjugately matching input impedance of the antenna 101 and output impedance of the matching circuit so as to have resistances which are equal to each other and reactances which have opposite signs but the same absolute value, as shown in a block diagram of FIG. 1 illustrating the communication card according to the first embodiment. The antenna 101 is placed to be electromagnetically coupled with a metallic body constituting the information device, via an internal wall of the card slot. The antenna matching means S varies a circuit parameter and detects a reflected signal from the antenna 101 at the transmission, and decides a circuit parameter so that the reflected signal has the smallest amplitude at the receiving.

In the communication card according to the first embodiment, the antenna matching means S is constituted by a variable matching unit 102a which can vary a circuit parameter in accordance with a control signal, a directional coupling unit 103 for extracting a reflected signal from the antenna 101, a detection unit 110 for detecting the amplitude of the reflected signal extracted by the directional coupling unit 103, and a control unit 109 for outputting a control signal to the variable matching unit 102a according to the amplitude of the reflected signal detected by the detection unit 110. The communication card according to the first embodiment further includes, as other components, an amplifier 104 for amplifying a high frequency signal at a RF band, a frequency converter 105 for converting an IF band signal into a RF band signal at the transmission and converting a RF band signal into an IF band signal at the receiving, a modulator/demodulator 106 for modulating an intermediate frequency signal (hereinafter, referred to as an IF signal) to obtain a baseband signal at the transmission and demodulating the IF signal to obtain a baseband signal at the receiving, a baseband processor 107 for processing the baseband signal, and a card interface 108 for exchanging data with the information device.

When the communication card constructed as described above is used, information flows in a following order at the transmission: the information device (data)→the card interface 108 (baseband signal)→the baseband processor 107 (modulated signal)→the modulator/demodulator 106 (IF signal)→the frequency converter 105 (radio frequency signal, hereinafter referred to as RF signal)→the amplifier 104 (RF signal)→the directional coupling unit 103 (RF signal)→the variable matching unit 102a (RF signal)→the antenna 101 (RF signal)→a signal to be transmitted (radio waves). The data received from the information device is modulated to obtain a signal at the RF band to be transmitted to the receiving end as radio waves.

At the receiving, information flows in a following order: a received signal (radio waves)→the antenna 101 (RF signal)→the variable matching unit 102a (FR signal)→the directional coupling unit 103 (RF signal)→the amplifier 104 (RF signal)→the frequency converter 105 (RF signal)→the modulator/demodulator 106 (IF signal)→the baseband processor 107 (modulated signal)→the card interface 108 (baseband signal)→the information device (data). The received waves at the RF band which are transmitted from the transmitting end are demodulated, and the data are transferred to the information device.

The above-mentioned flow of the information at the transmission or receiving is the same as that of the conventional communication card except in that the RF signal that is obtained by modulating the information passes through the variable matching unit 102a and the directional coupling unit 103, but the communication card according to the first embodiment is different from the conventional communication card in the following points.

A communication card is generally used being replaceably inserted into various information devices. Further, there are many cases where the information device is carried out with the communication card attached thereto. In cases where the conventional communication card is used in this way, when a part in the antenna portion of the communication card, protruding from the body that constitutes the information device is decreased, the antenna portion of the communication card electromagnetically couples with the metallic body that constitutes the information device or metallic components near the communication card (a clasp of a bag or the like), thereby deteriorating the antenna characteristics. This deterioration of the antenna characteristics appears as a reduction of the antenna matching degree. When the antenna matching degree is lowered, RF power that is to be outputted into space as radio waves via the antenna at the transmission does not go outside efficiently. As a result, part of the transmitted RF power reflects on the antenna input end, and returns to the transmission part. At the receiving, RF power that is to be received from the space via the antenna does not come in efficiently, whereby the received RF power is decreased.

In order to retain satisfactory communication properties, it is required to monitor the antenna matching degree and keep a satisfactory antenna matching degree.

Thus, according to the present invention, the antenna 101 of the communication card is used darlingly being electromagnetically coupled with the metallic body of the information device.

That is, the electromagnetic coupling between the antenna and the metallic body of the information device, the antenna and the metallic components near the antenna (a clasp of a bag or the like), or the like, which generally causes the deterioration of the antenna characteristics, is positively utilized.

More specifically, in the communication card according to the first embodiment, the antenna 101 is electromagnetically coupled with the metallic body of the information device via an internal wall of the card slot in the information device. Then, by automatically keeping a satisfactory antenna matching degree, the deterioration in the antenna characteristics due to the electromagnetic coupling between the antenna 101 and the metallic body of the information device is avoided, and further the metallic body is also used as a part of the antenna 101. A means for monitoring the antenna matching degree varies a parameter for the antenna matching circuit at the transmission, and detects power reflected from the antenna. With this construction, the satisfactory antenna matching degree can be monitored because the transmission power of the card is generally known. Further, a means for keeping a satisfactory antenna matching degree decides a circuit parameter for the variable matching unit at the receiving. With this construction, an extra time is not required to decide the parameter at the transmission of the card, resulting in a satisfactory antenna matching.

As for a method for providing satisfactory antenna matching in the communication antenna according to the first embodiment by the control unit 109, a flow of control in the control unit 109 will be described in detail, with reference to a flowchart of FIGS. 2 and 3 for explaining a control method in the control unit 109.

Figure 2:
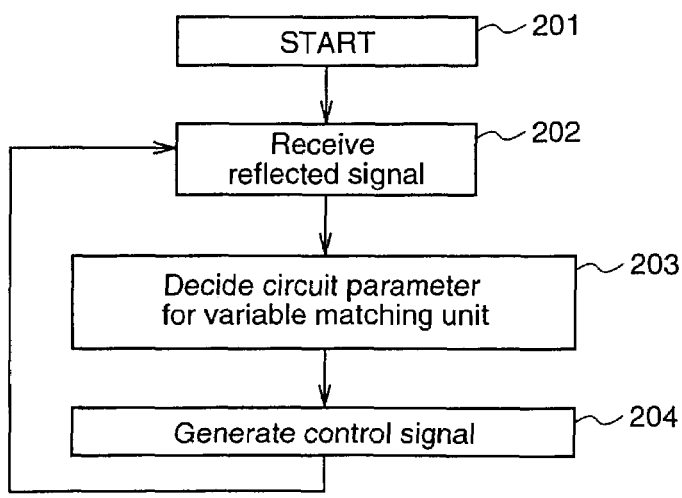
FIG. 2 is a flowchart for explaining a control method of a control unit for the communication card according to the first embodiment.

The control unit 109 includes a control signal generation means for implementing a control signal generation method as shown in FIG. 2 comprising: a first step 202 of receiving a signal reflected from the antenna 101, a second step 203 of deciding a circuit parameter for a variable matching unit 102a according to the amplitude of the reflected signal which is received in the first step 202, and a third step 204 of generating a control signal corresponding to the circuit parameter which is decided in the second step 203. This control signal generation means is constituted to perform these three steps 202 to 204 repeatedly in this order.

Figure 3:
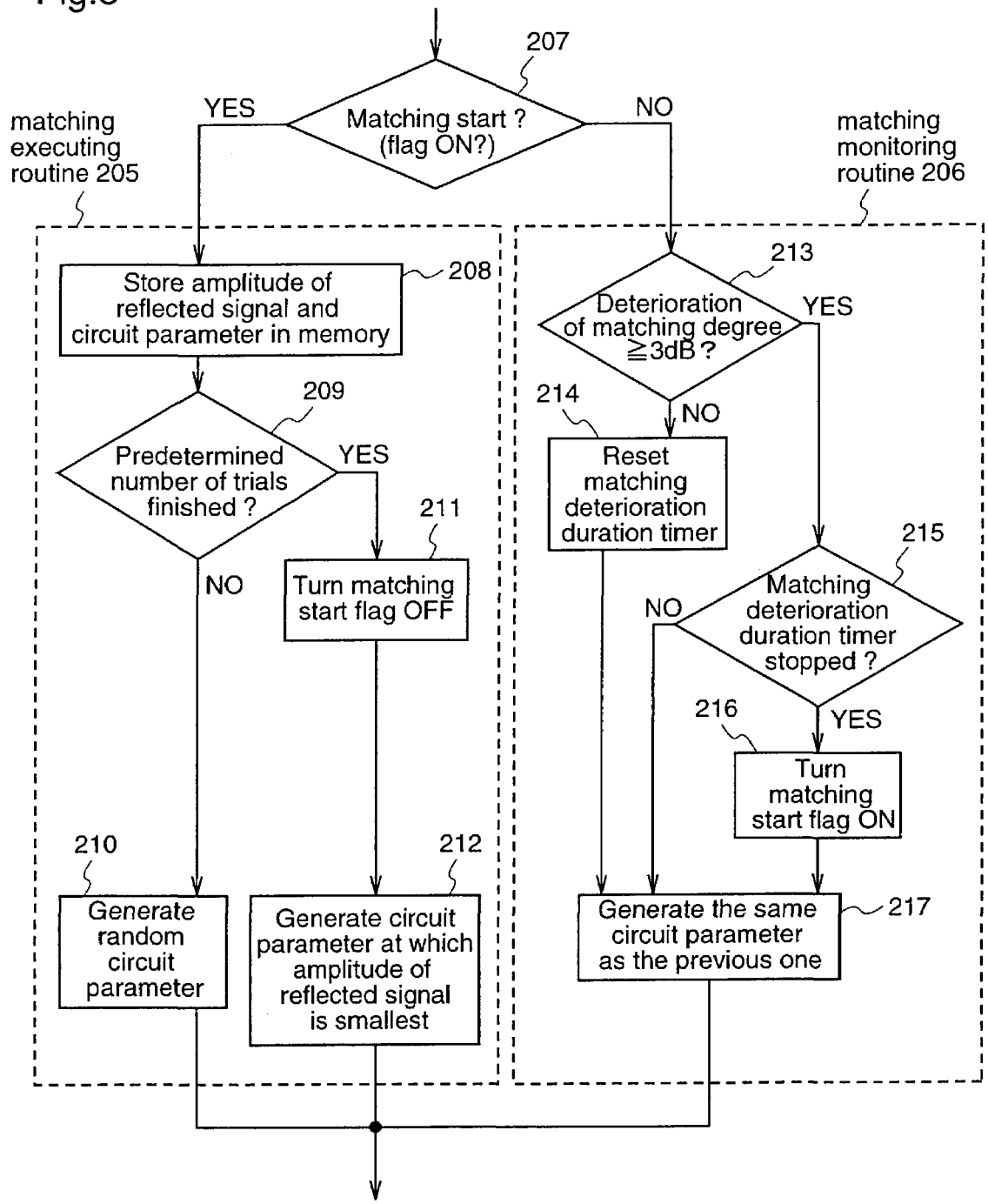
FIG. 3 is a flowchart for explaining a second step in FIG. 2 in more detail.

As shown in FIG. 3, the second step 203 is constituted by a matching executing routine 205 for executing matching of the antenna 101, a matching monitoring routine 206 for monitoring the matching of the antenna 101, and a selection step 207 for selecting one of the two routines. In the matching executing routine 205, random circuit parameters are generated to decide a circuit parameter at which a reflected signal from the antenna 101 is the smallest. In the matching monitoring routine 206, start of the conjugate match is decided when the deterioration degree of the conjugate match exceeds a threshold from two viewpoints: the level and the time. Step 208 is a step of storing the amplitude of the reflected signal and a corresponding circuit parameter value in a memory, Step 209 is a step of deciding whether a predetermined number of trials have been finished or not, Step 210 is a step of generating random circuit parameters for a variable matching unit, having no special correlation with the previously generated circuit parameter, Step 211 is a step of turning a matching start flag OFF, Step 212 is a step of selecting one of the circuit parameters stored in the memory, at which the amplitude of the reflected signal is the smallest, to output the same, Step 213 is a step of deciding whether or not the matching degree has been deteriorated by 3 dB or more, Step 214 is a step of resetting a timer that measures a duration in which the matching is being deteriorated, Step 215 is a step of deciding whether or not the matching deterioration duration timer has reached a limit value and stopped, Step 216 is a step of turning the matching start flag ON, Step 217 is a step of generating a circuit parameter for the variable matching unit, which is the same as the previous one.

In the flowchart that is constituted as described above, when the communication card is powered on, the control is started in the start step 201. Immediately after the start, an initial control signal is outputted from the control unit 109 to the variable matching unit 102a, and the matching start flag is ON.

When data is inputted from the information device that is using the communication card and then the communication card turns into a transmission mode, the antenna 101 does not establish complete matching having infinitesimal reflected power at entire bands for communication, so that part of the power transmitted from the antenna 101 is reflected. That is, part of the power transmitted from the antenna 101 flows in this order: the antenna 101→the variable matching unit 102a→the directional coupling unit 103.

The directional coupling unit 103 has a function of faintly extracting a signal that goes in a direction: the amplifier 104→the directional coupling unit 103→the variable matching unit 102a, and strongly extracting a signal that goes in a direction: the variable matching unit 102a →the directional coupling unit 103→the amplifier 104. Therefore, power corresponding to the amplitude of the signal that reflects on the antenna 101 is inputted to the detector 110.

The detector 110 detects the amplitude of the inputted power, and further eliminates extra high frequency band components via a low-pass filter to output the signal to the control unit 109.

The control unit 109 receives the signal outputted from the detector 110 as the amplitude of the reflected signal from the antenna 101. Step 202 for receiving the reflected signal corresponds to the series of operations at the transmission.

Next, when the communication card A turns into a receiving mode, the control unit 109 decides a circuit parameter for the variable matching unit 102a to improve the antenna matching on the basis of the amplitude of the received reflected signal. Step 203 for deciding a circuit parameter for the variable matching unit 102a corresponds to this operation.

When the communication card A again turns into the transmission mode, the control unit 109 generates a control signal for controlling the variable matching unit 102a according to the decided circuit parameter. Then, the generated control signal is outputted to the variable matching unit 102a, thereby varying the matching circuit parameter. The control signal generation step 204 corresponds to this operation.

Here, Step 203 for deciding the circuit parameter for the variable matching unit 102a will be described in more detail with reference to FIG. 3.

Initially, it is decided in Step 207 whether the matching start flag is ON or not. When the matching flag is ON (the matching start flag is ON immediately after the power-up), the matching executing routine 205 is selected.

In the matching executing routine 205, the value of the reflected signal and a presently generated circuit parameter (this is an initial value circuit parameter immediately after the power is tuned on) are stored in a memory in Step 208.

Then, in Step 209, it is decided whether a predetermined number of trials have been finished or not. When the predetermined number of trials have not been finished, the operation proceeds to Step 210, in which random circuit parameters are generated. When the predetermined number of trials have been finished, the operation proceeds to Step 211, thereby turning the matching start flag OFF (matching end is informed).

Then in Step 212, data at which the reflected signal has the smallest amplitude is read from all trial results that are stored in the memory, and a circuit parameter at that time is outputted.

Next, when the matching start flag is OFF on the basis of the decision in Step 207 (the predetermined number of trials have been finished and the matching end has been informed in the matching executing routine), the matching monitoring routine 206 is selected.

In the matching monitoring routine 206, it is initially decided in Step 213 whether or not the matching degree is deteriorated by a predetermined value or more (3 dB or more in this case) after the matching start flag is turned OFF (i.e., after the match executing routing is finished).

When the matching is not so deteriorated, a timer for measuring duration of matching deterioration is reset in Step 214, and the same circuit parameter as the previous one is generated in Step 217. When the matching is so deteriorated, it is further decided in Step 215 whether or not the timer for measuring the duration of matching deterioration has reached a limit value and stopped. When the timer has not stopped, the same circuit parameter as the previous one is generated in Step 217. When the timer has stopped, the matching start flag is turned ON in Step 216 (matching start is informed), and the circuit parameter as the previous one is generated in Step 217.

When Step 203 for deciding the circuit parameter for the variable matching unit 102a is constituted as described above, a function that random circuit parameters are generated in the control unit 109 of the communication card according to the first embodiment, so that a minimum matching point can always be found even when a variable matching unit having a limited immittance area in which matching can be established is used, and a function that the matching deterioration is detected only in cases where the deterioration has a predetermined value or more and continues for a predetermined time period or longer, so that the time that is to essentially be used for the communication is not wasted by executing the matching more than required, can be realized.

Next, the directional coupling unit 103 that is used for the communication card according to the first embodiment will be described with reference to FIG. 4.

Figure 4:
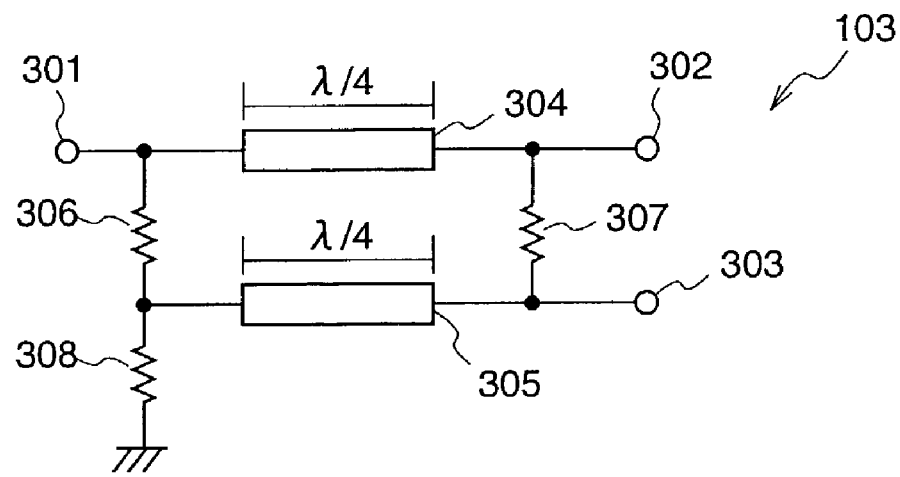
FIG. 4 is a circuit diagram showing a directional coupling unit in the communication card according to the first embodiment.

As shown in a circuit diagram of FIG. 4 illustrating the directional coupling unit, the directional coupling unit 103 includes two microstrip lines 304 and 305 (assuming here that each has the length of a ¼wavelength), two coupling resistors 306 and 307, and one end resistor 308. Both ends of the two microstrip lines 304 and 305 are connected by the two coupling resistors 306 and 307, respectively, and an end of one of the two microstrip lines 304 and 305 (here, the microstrip line 305) and a grounding conductor are connected by the end resistor 308. Here, numeral 301 denotes a first terminal that is connected to the variable matching unit 102a, numeral 302 denotes a second terminal that is connected to the amplifier 104, and numeral 303 denotes a fourth terminal that is connected to the detector.

Generally, the reflected signal from the antenna 101 can be separated/extracted by using the directional coupling unit 103. Further, various methods such as a slot coupling waveguide method and a distribution coupling microstrip line method have been gone into actual use for the directional coupling unit 103 (the directional coupling unit is described in more detail in "Antenna Technology Handbook" (Ohmsha Ltd., (1999), edited by the Institute of Electronics, Information and Communication Engineer (IEICE)), and the like).

Here, the communication card according to this first embodiment employs a ¼-wavelength microstrip line method having coupling resistors as the directional coupling unit 103.

When the directional coupling unit 103 employing the ¼-wavelength microstrip lines is adopted, a printed circuit can be commonly used with other circuit components that constitute the communication card, whereby the communication card according to this embodiment can be realized without increasing the manufacturing costs of the communication card. Further, when the coupling resistors are used as a method for extracting the reflected components, satisfactory extraction of the reflected signal can be performed in a communication card construction which cannot form the circuit part more highly as compared to a method which employs a side coupling of the two microstrip lines placed in the proximity and in parallel to each other, without the coupling degree being deteriorated by the influence of a sealed case of the communication card.

Next, the variable matching unit 102a in the communication card according to the first embodiment will be described with reference to FIG. 5.

Figure 5:
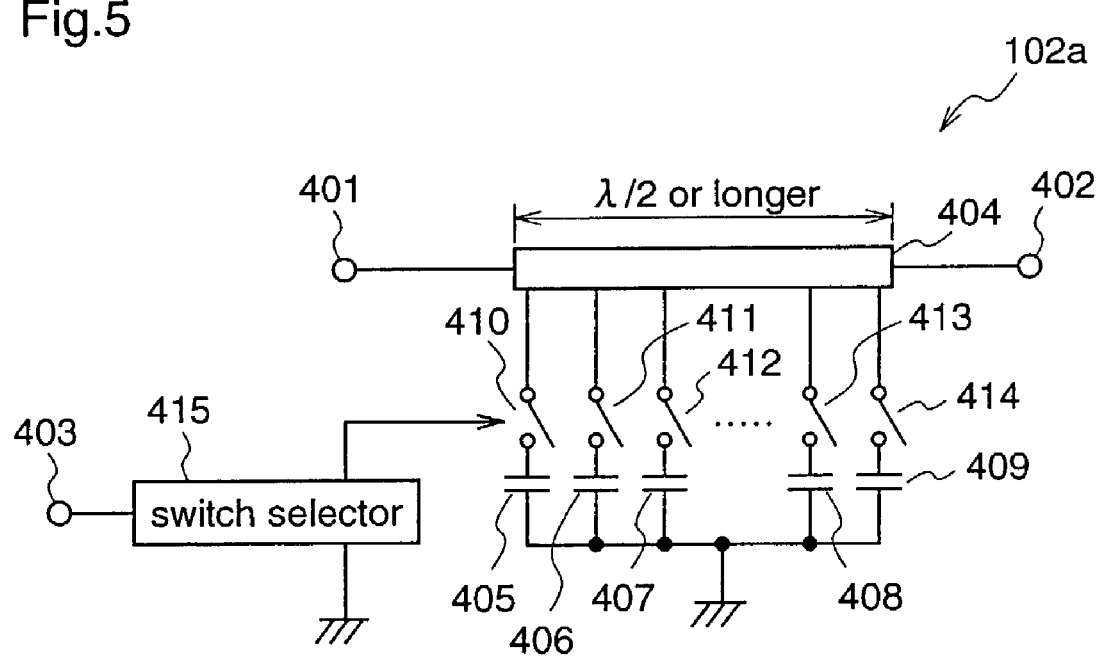
FIG. 5 is a circuit diagram showing a variable matching unit in the communication card according to the first embodiment.

As shown in a circuit diagram of FIG. 5 illustrating the variable matching unit 102a, the variable matching unit 102a includes plural capacitors 405 to 409, first switches 410 to 414 for making an arbitrary capacitor among the plural capacitors 405 to 409 effective, and a first switch selector 415 for controlling the first switches 410 to 414. Here, numeral 401 denotes an antenna terminal, numeral 402 denotes a directional coupling unit terminal, and numeral 403 denotes a control unit terminal. The capacitors 405 to 409 are connected between a microstrip line 404 of an arbitrary length (the length is λ/2 in this figure, but the length is assumed to be arbitrary) and a grounding conductor at regular intervals. The switch selector 415 opens/closes the switches 410 to 414 upon receipt of the control signal from the control unit 109, to select a required capacitor from the capacitors 405 to 409. When the required capacitor is selected, the corresponding circuit parameter can be obtained, whereby matching can be performed.

Figure 6:
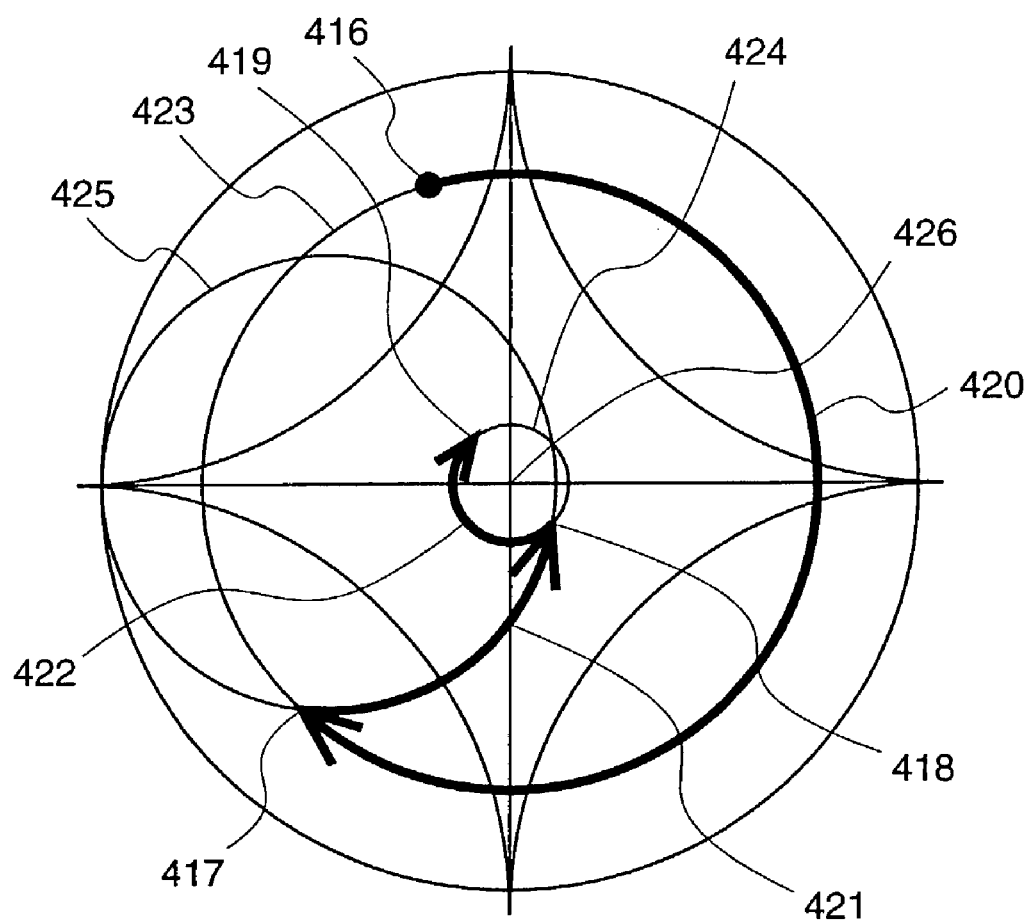
FIG. 6 is an immittance chart for showing an operational principle of the variable matching unit in the communication card according to the first embodiment.

The state of the matching will be described in more detail with reference to an immittance chart of FIG. 6, showing an operational principle of the variable matching unit.

In FIG. 6, numeral 416 denotes a point indicating an immittance in a case where the antenna side is seen from the antenna terminal 101, numeral 417 denotes a point indicating an immittance in a case where the antenna side is seen from the microstrip line 404, numeral 418 denotes a point indicating an immittance after the matching is obtained, and numeral 419 denotes a point indicating an immittance in a case where the antenna side is seen from the directional coupling unit terminal 402. Numerals 420, 421 and, 422 denote paths of the immittances. Numerals 423 and 424 denote circles at a constant standing wave ratio (SWR). Numeral 425 denotes a circle at a constant conductance. Numeral 426 denotes an origin of the chart.

In this immittance chart, as shown by the path 420, the immittance 417 in a case where the antenna side is seen from the microstrip line 404 is obtained by moving the immittance 416 in a case where the antenna side is seen from the antenna terminal on the circle 423 at the constant SWR by a length In this immittance chart, as shown by the path 420, the immittance 417 in a case where the antenna side is seen from the microstrip line 404 is obtained by moving the immittance 416 in a case where the antenna side is seen from the antenna terminal on the circle 423 at the constant SWR by a length corresponding to the length of the microstrip line. Further, as shown by the path 421, the immittance 418 after the matching is obtained is obtained by moving the immittance 417 in the case where the antenna side is seen from the microstrip line 404 on the constant conductance circle 425 by an immittance of a capacitor to be connected. Further, as shown by the path 422, the immittance 419 in a case where the antenna side is seen from the directional coupling unit terminal 402 is obtained by moving the immittance 418 after the matching is obtained on the constant SWR circle 424 by a length corresponding to the length of the remaining microstrip line.

In this immittance chart, the standing wave ratio is smaller at a position that is nearer to the origin 426, which shows a state in which the matching is obtained. Therefore, it can be seen from the above-mentioned path of the immittance that this variable matching unit can obtain the matching efficiently.

The movement of the immittance as shown by the path 422 is unnecessary from the point of view of establishing the matching, but it does not deteriorate the SWR and accordingly the function of the variable matching unit is not affected.

When the variable matching unit 102a that is constructed as described above is employed, the printed board can be commonly used with other circuit components of the communication card according to the first embodiment. Accordingly, the communication card according to the first embodiment can be realized without increasing the costs.

Figure 7:
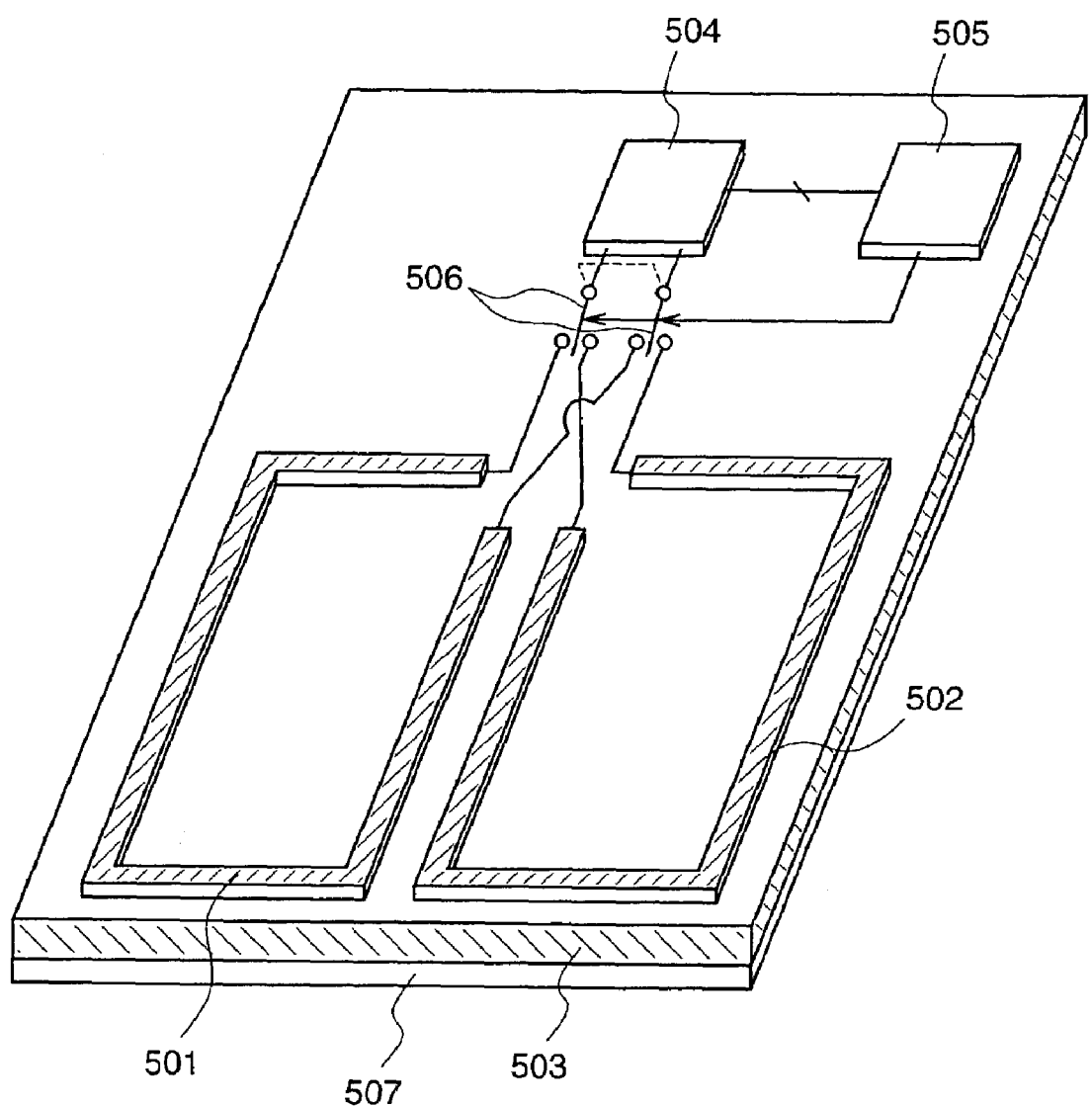
FIG. 7 is a perspective view schematically showing an antenna in the communication card according to the first embodiment.

The antenna 101 in the communication card according to the first embodiment will be described with reference to a perspective view of FIG. 7 schematically showing the antenna 101.

The communication card according to the first embodiment includes, as the antenna 101, plural antennas 501 and 502 having different polarized waves as shown in FIG. 7, and has a selectively switching means for selectively switching between these plural antenna 501 and 502. More specifically, the antennas 501 and 502 are rectangular loop antennas which use lines of a printed board 503. Numeral 503 denotes a printed board, numeral 504 denotes a transmission/receiving part, numeral 505 denotes a control part, numeral 506 denotes a switch, and numeral 507 denotes a grounding conductor. The plural antennas 501 and 502 having different polarized waves are antennas which generate two elliptic polarized waves having opposite rotations.

Generally, antennas are placed in positions which are linearly asymmetrical to each other (relationship in which these antennas do not coincide and are not superimposed with each other when folded laterally with respect to an axis of symmetry), and have characteristics of generating polarized waves when power is fed from a point on the axis of asymmetry. Therefore, the two rectangular loop antennas 501 and 502 in the first embodiment are placed in positions which are linearly asymmetrical with each other as shown in FIG. 7, and two elliptic polarized waves having opposite rotations are generated when the power is fed from corners of the rectangles. (Details of the rectangular loop antenna are specifically described in "Rectangular loop antenna for circular polarized wave", by Murakami Yuichi, Nakamura Takashi et al., IEICE transactions (B-II), Vol. J78-B-II, No. 7, pp. 520–527 (July 1995), and the like.)

The antennas 501 and 502 are constructed planarly on the printed board 503, so that the generated two elliptic polarized waves having the opposite rotations strongly electromagnetically couple with a metallic body of an information device to which the communication card is attached, and have different directions in which the metallic body is excited. Therefore, the metallic body equivalently operates as different two antennas. The metallic body of the information device operating equivalently as different two antennas can be switched equivalently by switching an antenna to be excited between the rectangular loop antennas 501 and 502.

When the antennas 501 and 502 which are constructed as described above are employed, the printed board 503 can be commonly used with other circuit components of the communication card A. Accordingly, the communication card A according to the first embodiment can be realized without increasing the manufacturing costs.

Figure 8:
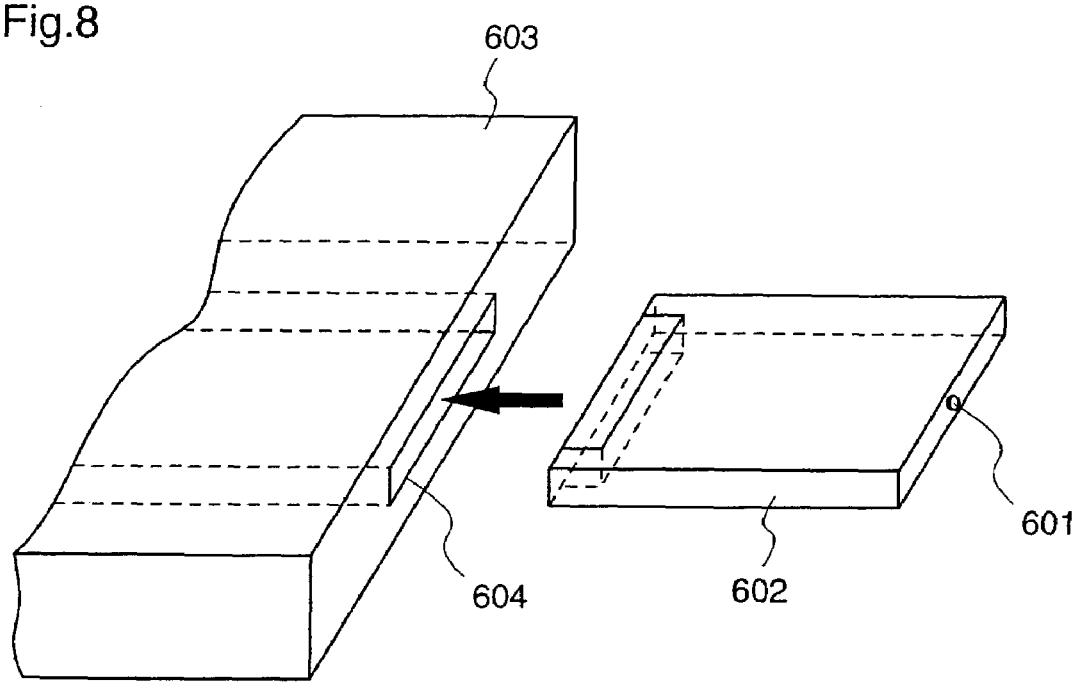
FIG. 8 is a perspective view schematically showing the communication card according to the first embodiment, having an antenna switch button.

Next, an antenna switch button that is used to switch an antenna to be excited between the rectangular loop antennas 501 and 502, and antenna switch software that is mounted on the information device will be described with reference to a perspective view of FIG. 8 schematically illustrating a communication card 602 having an antenna switch button. As shown in FIG. 8, an antenna switch button 601 as a selectively switching means is provided on an end surface of the communication card 602, and switching between the plural antennas 501 and 502 having different polarized waves is performed when the switch button 601 is pushed. Numeral 603 denotes an information device, and numeral 604 denotes a card slot.

When the antenna switch button 601 is pushed while the communication card 602 is being inserted into the card slot 604 of the information device 603, the switching between the plural antennas 501 and 502 to be excited is performed. The metallic body that is electromagnetically coupled with the antennas 501 and 502 operates equivalently as antennas, and thus switching between the plural metallic body antennas is also performed.

Here, the antenna switch button 601 is provided on the end surface of the communication card 602, whereby it is possible to perform the switching between the antennas 501 and 502 with the communication card 602 being inserted into the card slot 604 of the information device 603.

Further, it is conceivable that switching between the plural antennas 501 and 502 to be excited in the communication card 602 is performed by request from the antenna switch software that is mounted on the information device 603. The metallic body that electromagnetically couples with these antennas operates equivalently as antennas, and thus switching between the plural metallic body antennas is equivalently performed. Accordingly, switching of the antennas can be performed with the communication card 602 being inserted into the card slot 604 of the information device 603.

As described above, the switching between the plural antennas having different polarized waves is performed in accordance with the antenna switch button that is provided on the end surface of the communication card, or software that is mounted on the information device. Accordingly, even when the state of waves is changed by changing the position of the information device during use of the communication card, the switching between plural metallic body antennas can be equivalently performed to select an optimum antenna, with the communication card being inserted into the card slot of the information device. Even when the equivalent metallic body antenna is changed and the matching degree of the antenna is deteriorated, the above-mentioned automatic matching function is activated, and satisfactory communication characteristics are always realized, whereby a communication card having a higher operability can be realized by synergy with the antenna selection function.

In this first embodiment, the case where a communication card is attached to an information device having a card slot has been described, while a communication device which is attached to a connector of an information device may be employed, and it can provide the same effects.

EMBODIMENT 2

A communication card defined in claims 9 to 10 and 19 to 20 of the present invention will be described as a second embodiment with reference to the drawings.

To describe the communication card according to the second embodiment, the same components as those of the above-mentioned communication card A are denoted by the same reference numerals and are not described here. The communication card according to the second embodiment is different from the above-mentioned communication card according to the first embodiment only in the structure of the variable matching unit. Accordingly, a variable matching unit 102b in the communication card according to the second embodiment will be hereinafter described.

Figure 9:
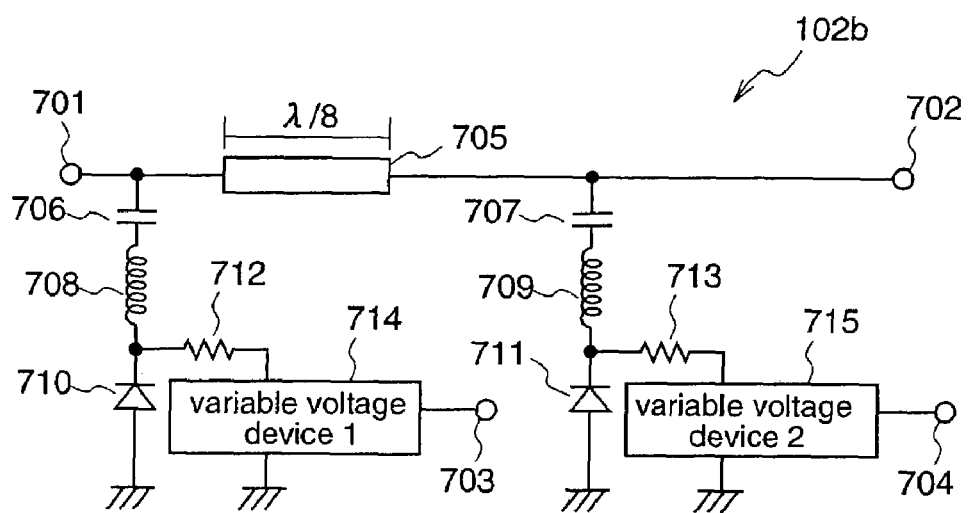
FIG. 9 is a circuit diagram showing a variable matching unit in a communication card according to a second embodiment of the present invention.

As shown in a circuit diagram of FIG. 9, a variable matching unit 102b in the communication card according to the second embodiment includes a microstrip line 705 of an arbitrary length (it is assumed here to have a length corresponding to a ⅛-wavelength), two varactor diodes 710 and 711, two variable voltage devices 714 and 715 which generate voltages which are to be added to the two varactor diodes 710 and 711, respectively, two capacitors 706 and 707, two coils 708 and 709, and two resistors 712 and 713. The capacitors 706 and 707, the coils 708 and 709, and varactor diodes 710 and 711 are connected in series between both ends of the microstrip line 705 having a length corresponding to a ⅛-wavelength, and grounding conductors, respectively. The resistors 712 and 713, and the variable voltage devices 714 and 715 are connected in series between contacts of the coils 708 and 709 and the varactor diodes 710 and 711 which are connected in series, and grounding conductors, respectively.

The variable voltage devices 714 and 715 supply voltages to the varactor diodes 710 and 711 upon receipt of control signals from the control unit 109. Then, immittances of the varactor diodes vary adaptively to the supplied voltages, whereby the matching can be obtained. The capacitors 706 and 707 are for preventing a direct current, the coils 708 and 709 are for generating an inductive immittance, and the resistors 712 and 713 are for preventing a high frequency.

Figure 10:
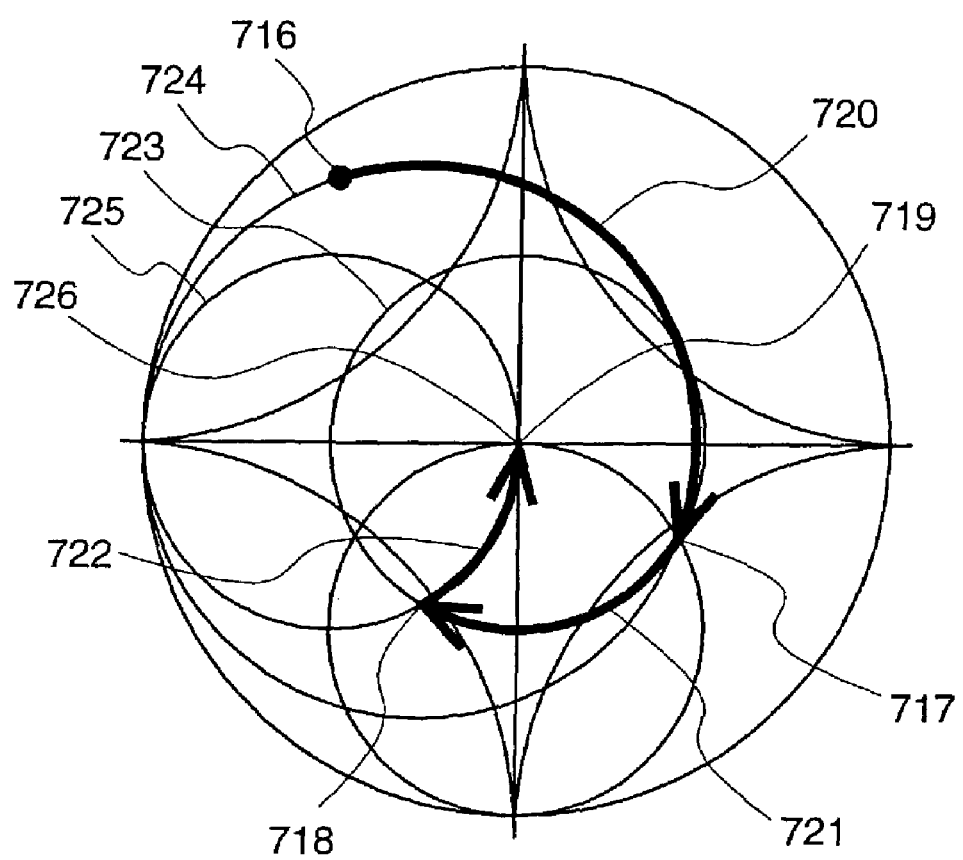
FIG. 10 is an immittance chart for showing an operational principle of the variable matching unit in the communication card according to the second embodiment.

The state of the matching when using the variable matching unit 102b that is constructed as described above will be described in more detail, with reference to an immittance chart of FIG. 10 showing an operational principle of the variable matching unit 102b.

In FIG. 10, reference numeral 716 denotes a point indicating an immittance in a case where the antenna side is seen from the antenna terminal 701, numeral 717 denotes a point indicating an immittance that is obtained by connecting an immittance based on the serial connection of the capacitor 706, the coil 708 and the varactor diode 710, to the immittance 716, numeral 718 denotes a point indicating an immittance in a case where the antenna side is seen from the microstrip line having a length corresponding to a ⅛-wavelength, numeral 719 denotes a point indicating an immittance that is obtained by connecting an immittance based on the serial connection of the capacitor 707, the coil 709 and the varactor diode 711, to the immittance 718, and simultaneously indicates an immittance in a case where the antenna side is seen from the directional coupling unit terminal 702. Further, numerals 720, 721, and 722 denote paths of immittances. Numeral 723 denotes a constant SWR circle. Numerals 724 and 725 denote constant conductance circles. Numeral 726 denotes an origin of the chart.

In this immittance chart, the immittance 717 is obtained by moving the immittance 716 on the constant conductance circle 724 by an immittance based on the serial connection of the capacitor 706, the coil 708 and the varactor diode 710, as shown by the path 720. The immittance 718 is obtained by moving the immittance 717 on the constant SWR circle 723 by the microstrip line having a length corresponding to a ⅛wavelength, as shown by the path 721. Further, the immittance 719 is obtained by moving the immittance 718 on the constant conductance circle 725 by an immittance based on the serial connection of the capacitor 707, the coil 709, and the varactor diode 711, as shown by the path 722. It is needless to say that this can be realized by a construction in which the coil 709 and the varactor diode 711 are connected in parallel.

This immittance chart shows a state in which the SWR is smaller at a position that is nearer to the origin 726, and the matching is established more. Therefore, from the path of the immittance, it can be seen that the variable matching unit can efficiently obtain the matching.

Accordingly, when the variable matching unit 102b that is constructed as described above is employed, the printed board can be commonly used with other circuit components of the card, whereby the card having the antenna matching means according to the present invention can be realized without increasing the costs.

Figure 11:
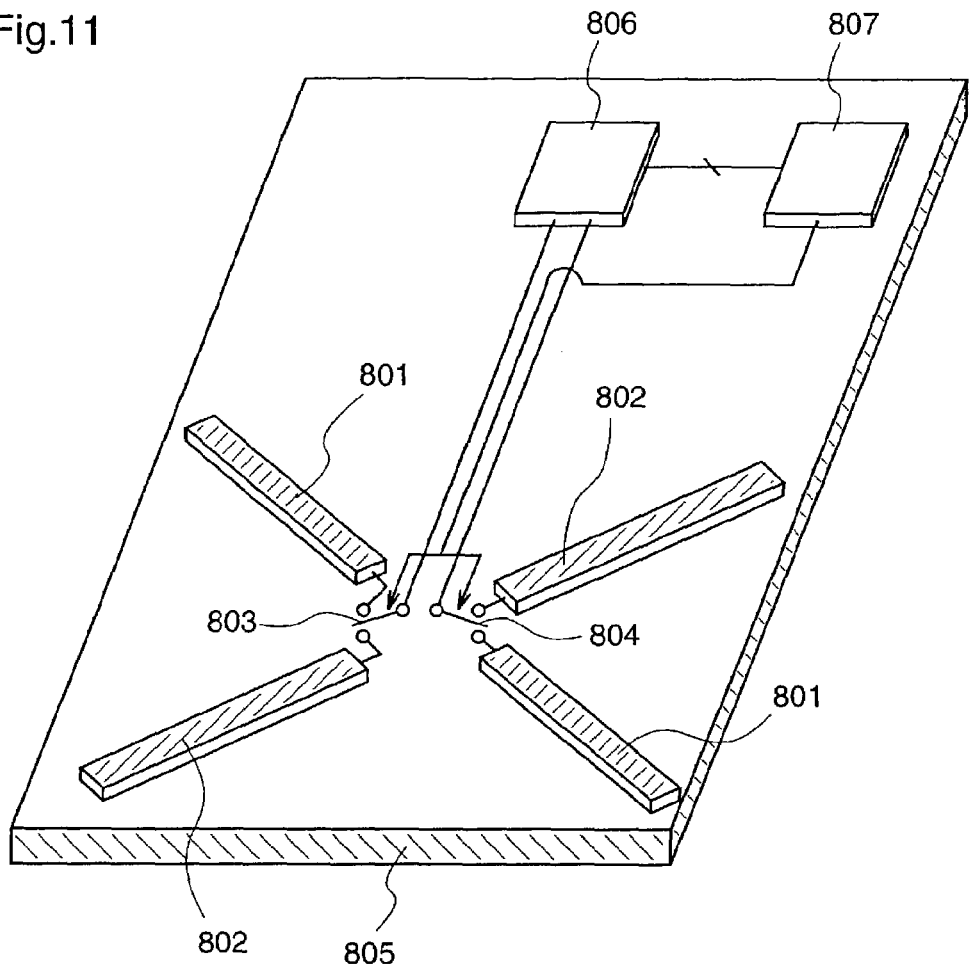
FIG. 11 is a perspective view schematically showing an antenna according to the communication card according to the second embodiment.

Next, an antenna in the communication card that uses the variable matching unit 102b will be described with reference to a perspective view of FIG. 11 illustrating an antenna.

It is assumed here that the communication card includes plural antenna having different polarized waves, and further includes a selectively switching means for selectively switching these antennas. As shown in FIG. 11, the plural antennas having the polarized waves are two dipole antennas 801 and 802 which are placed orthogonally to each other. The communication card further includes lines of a printed board 805, a folded conductive board, and PIN diode switches 803 and 804. In this figure, numeral 806 denotes a transmission/receiving part, and numeral 807 denotes a control part.

Initially, the switches 803 and 804 are opened or closed in accordance with a control signal from the control part 807 to work together, to select one of the two dipole antennas 801 and 802. Here, as the two dipole antennas 801 and 802 are placed orthogonally to each other, two generated electric fields are also orthogonal to each other.

The antennas are constructed planarly on the printed board 805, so that two radio waves having the generated electric fields which are orthogonal to each other electromagnetically couple strongly with the metallic body of the information device to which the communication card is attached, and have different directions in which the metallic body is excited. Accordingly, the metallic body operates equivalently as two different antennas.

The metallic body of the information device, operating equivalently as the two different antennas can be equivalently switched by selecting one of the dipole antennas to be excited.

When the antenna that is constructed as described above is employed, the printed board can be commonly used with other circuit components of the communication card, whereby the communication card having the antenna matching means according to the second embodiment can be realized without increasing the costs. Further, the plural different antennas equivalently having different polarized waves are employed and one of the antennas can be selected, so that an antenna can be selected according to the state of the waves, and satisfactory communication can be realized in the communication card.

EMBODIMENT 3

A communication card defined in claims 11 to 14 and 21 and 22 according to the present invention will be described as a third embodiment, with reference to the drawings.

To describe the communication card according to the third embodiment, the same members as those in the communication card according to the first embodiment are denoted by the same reference numerals, and their descriptions are omitted. The communication card according to the third embodiment is different from the communication card according to the first embodiment only in the structure of the variable matching unit. Accordingly, a variable matching unit 102c in the communication card according to the third embodiment will be hereinafter described.

Figure 12:
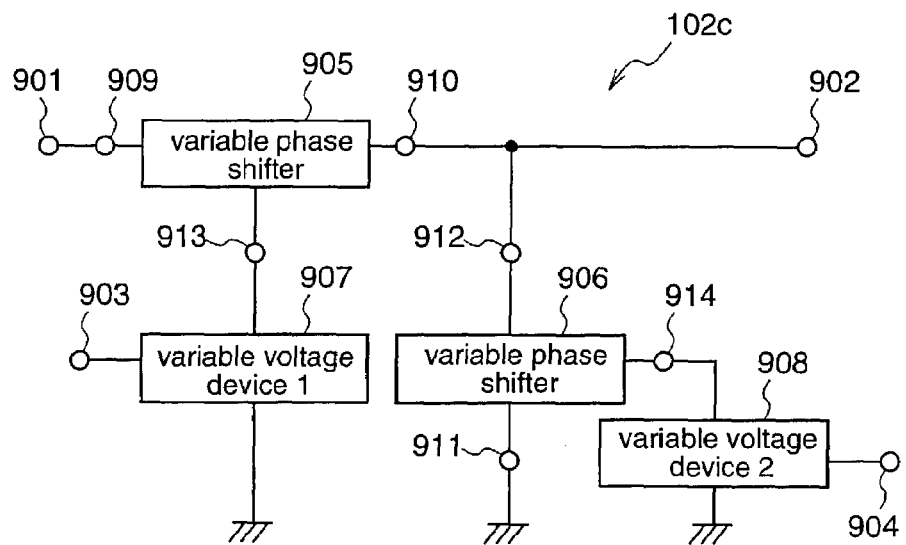
FIG. 12 is a circuit diagram illustrating a variable matching unit in a communication card according to a third embodiment of the present invention.

As shown in FIG. 12, the variable matching unit 102c in the communication card employs two variable phase shifters which can vary a phase amount of a signal that passes through the phase shifter itself. Assuming that one of these variable phase shifters is a first variable phase shifter and the other is a second variable phase shifter, the first variable phase shifter is connected between an input terminal of the antenna and an input terminal of the variable matching unit 102c, and the second variable phase shifter is connected between the input terminal of the variable matching unit 102c and a grounding conductor. The variable phase shifters 905 and 906 are a first voltage variable phase shifter 905 and a second voltage variable phase shifter 906 which have the passed phase amounts varying according to the voltages, and variable voltage devices 907 and 908 are included for generating voltages to be applied to the variable phase shifters 905 and 906. The variable matching unit 102c further includes an antenna terminal 901, a directional coupling unit terminal 902, a control unit terminals 903 and 904, input/output terminals 909 to 912 for the variable phase shifters, and control terminals 913 and 914 for the variable phase shifter.

Figure 13:
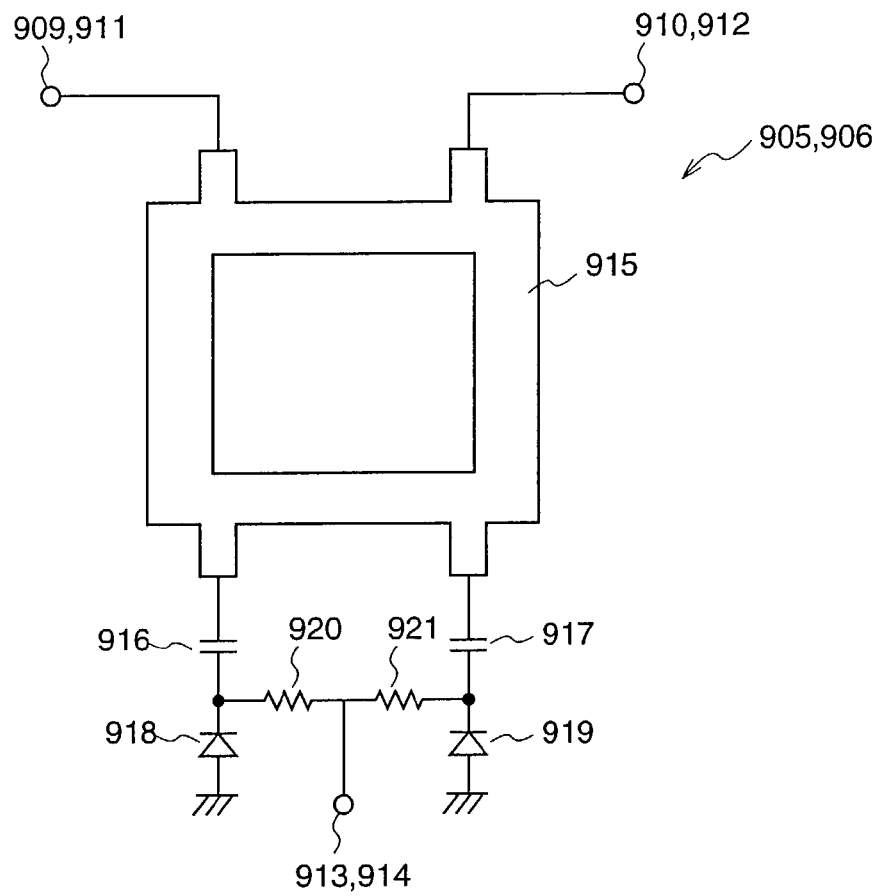
FIG. 13 is a circuit diagram illustrating a variable phase shifter in the communication card according to the third embodiment.

As shown in a circuit diagram of FIG. 13, the variable phase shifters 905 and 906 according to the third embodiment each include a hybrid coupler 915 that is constituted by a microstrip line having a length corresponding to a ¼wavelength, and two varactor diodes 918 and 919. The variable phase shifters 905 and 906 further include input/output terminals 909 to 912 for the variable phase shifters, control terminals 913 and 914 for the variable phase shifters, capacitors 916 and 917, and resistors 920 and 921.

The variable matching unit 102c that is constructed as described above will be described.

The variable voltage devices 907 and 908 supplies voltages to the variable phase shifters 905 and 906, upon receipt of a control signal from the control unit 109. The supplied voltages are applied to the varactor diodes 918 and 919 via the resistors 920 and 921. The phases of the signals that continuously pass through the variable phase shifters 905 and 906 which are constituted by the hybrid coupler 915 can be changed by the applied control voltages, thereby realizing matching. Here, the capacitors 916 and 917 are for preventing direct currents, and the resistors 920 and 921 are preventing high frequencies. (Details of the hybrid coupler and the phase shifter are described in "Microwave Engineering" by Nakajima Masamitsu (Morikita Shuppan Co., Ltd., 1980), "Microwave Circuits for Communications" by Miyauchi Kazuhiro et al. (IEICE, 1981), and the like.)

The state of matching when using the variable matching unit 102c will be described in more detail with reference to an immittance chart shown in FIG. 14.

Figure 14:
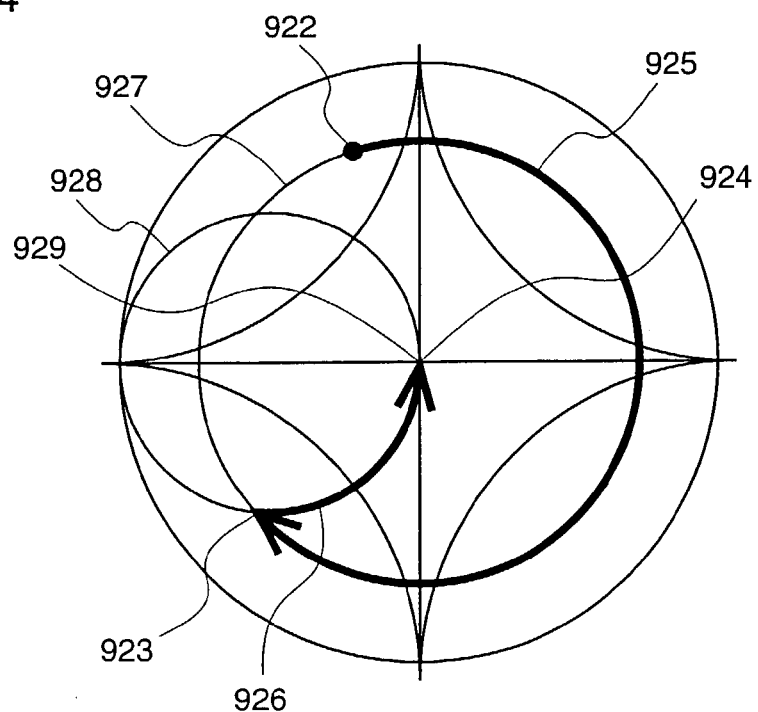
FIG. 14 is an immittance chart for showing an operation principle of the variable matching unit in the communication card according to the third embodiment.

In FIG. 14, reference numeral 922 denotes a point indicating an immittance in a case where the antenna side is seen from the antenna terminal 901. Numeral 923 denotes a point indicating an immittance in a case where the antenna side is seen from a terminal 910 of the variable phase shifter 905. Numeral 924 denotes a point indicating an immittance in a case where the antenna side is seen from the directional coupling unit terminal 902. Numerals 925 and 926 denote paths of the immittances. Numeral 927 denotes a constant SWR circle. Numeral 928 denotes a constant conductance circle. Numeral 929 denotes an origin of the chart.

In this immittance chart, the immittance 923 is obtained by moving the immittance 922 on the constant SWR circle 927 by a phase amount shifted by the variable phase shifter 905, as shown by the path 925. The immittance 929 is obtained by moving the immittance 923 on the constant conductance circle 928 by an immittance which is generated by phase-shifting a short-circuited end by the variable phase shifter 906, as shown by the path 926.

This immittance chart shows that the SWR is smaller at a point nearer to the origin 929, and the matching is more established. Therefore, it can be seen from the paths of the immittances that this variable matching unit can efficiently establish the matching.

When the variable matching unit 102c that is constructed as described above is employed, the printed board can be commonly used with other circuit components of the communication card. Accordingly, the communication card having the antenna matching means according to the third embodiment can be realized without increasing the costs.

Figure 15:
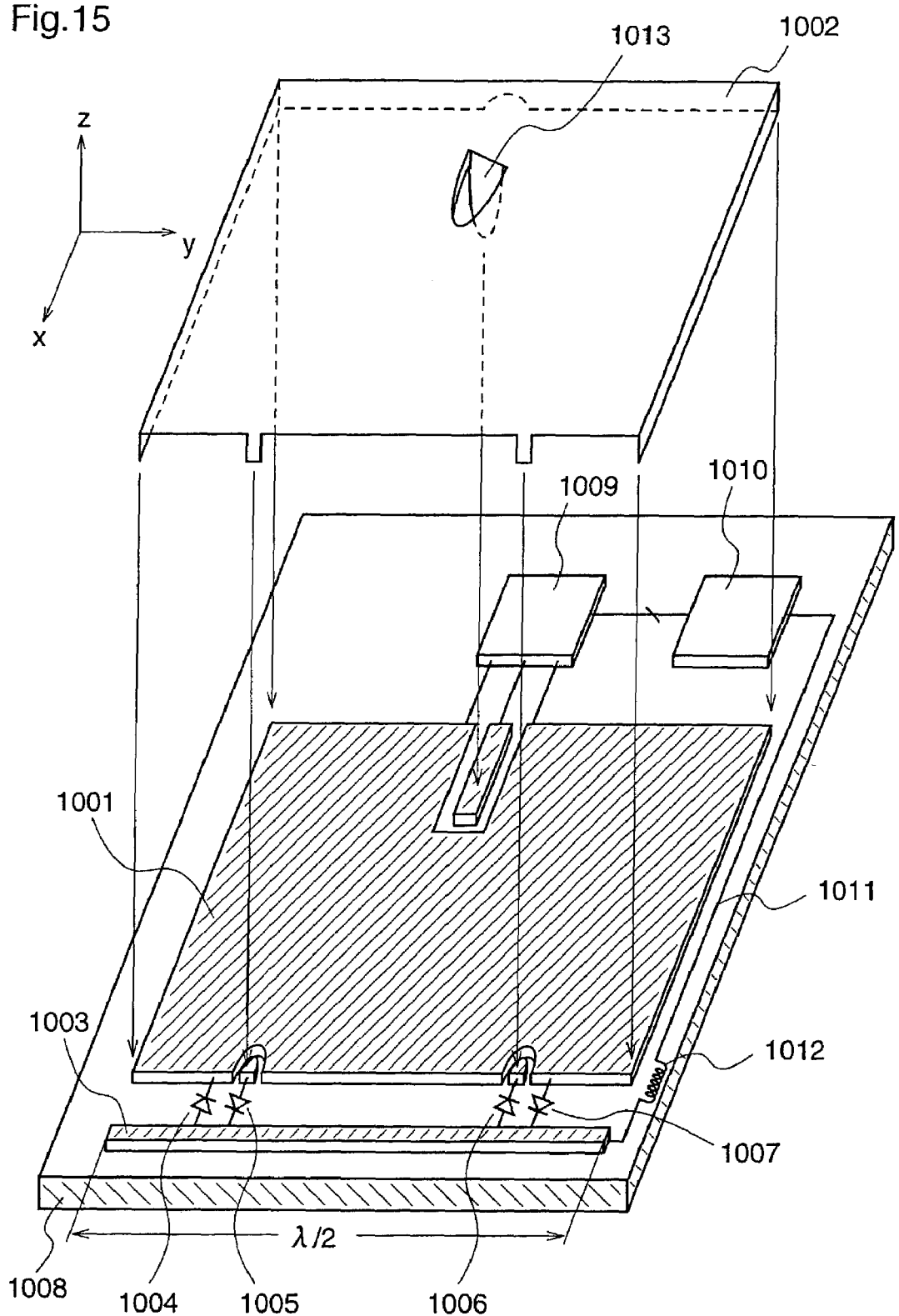
FIG. 15 is a perspective view schematically showing an antenna in the communication card according to the third embodiment.
Figure 16:
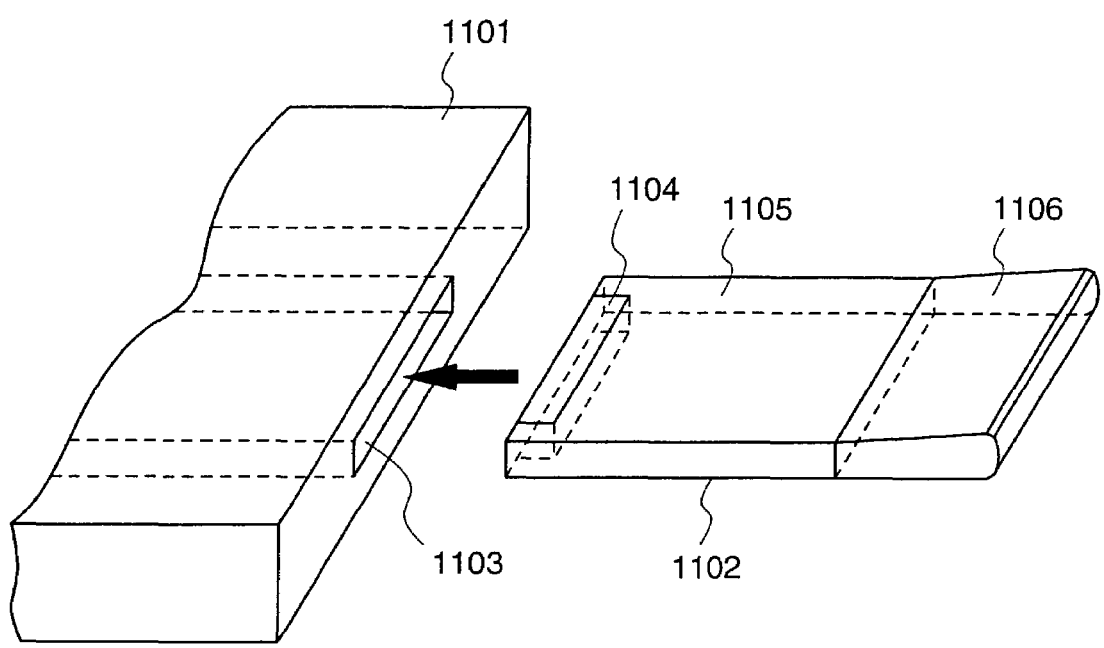
FIG. 16 is a perspective view showing a usage manner of a conventional communication card.
Figure 17:
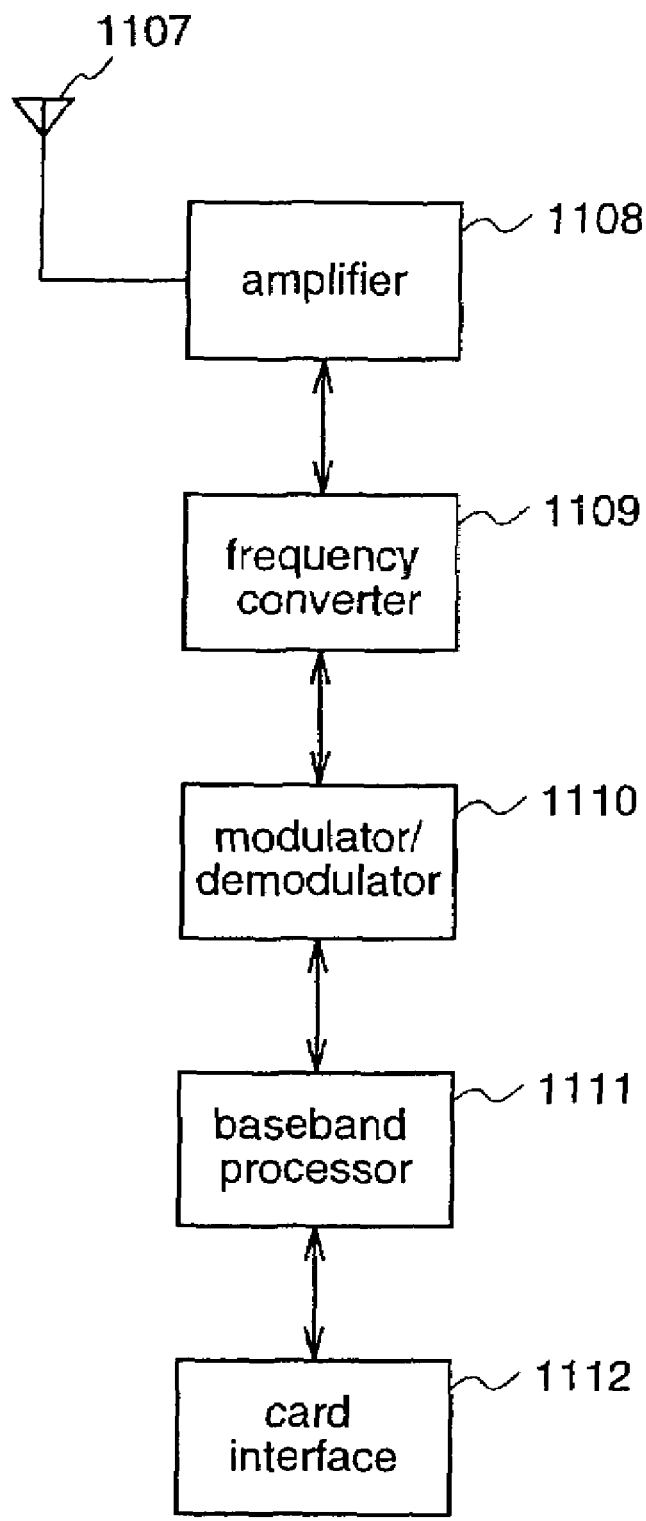
FIG. 17 is a block diagram illustrating a conventional communication card.

Next, an antenna in the communication card using this variable matching unit 102c will be described with reference to a perspective view of FIG. 15 illustrating an antenna.

It is assumed here that the communication card includes plural antennas having different polarized waves, and a selectively switching means for selectively switching these antennas. These plural antennas having different polarized waves are characterized in that three electric fields having different polarized waves are generated by controlling electric fields generated by a waveguide antenna and a ½-wavelength linear antenna 1003, and comprise a waveguide antenna that is constituted by a wiring 1001 of a printed board and a folded conductor plate 1002, and one linear antenna 1003 having a length corresponding to a ½ wavelength in the vicinity of an opening surface of the waveguide antenna. The linear antenna is placed to generate an electric field that is perpendicular to an electric field that is generated by the waveguide antenna, and an opening wall of the waveguide antenna and the linear antenna are connected by switches 1004 to 1007. The communication card further includes a printed board 1008, a transmission/receiving part 1009, a control part 1010, a switch control line 1011, a coil 1012, and an antenna power supply terminal 1013.

The antenna that is constructed as described above will be explained. The wiring 1001 of the printed board and the folded conductor plate 1002 are connected to form a rectangular waveguide. As one side of the rectangular waveguide (far side in FIG. 15) is short-circuited by using a folded part of the conductor plate 1002 and the other side (near side in FIG. 15) is opened, the rectangular waveguide operates as a waveguide antenna. The wave guide antenna is excited from the antenna power supply terminal 1013, and generates radio waves having an electric field in a Z direction in this figure.

Further, the ½-wavelength linear antenna 1003 is placed in the vicinity of the opening of the waveguide antenna, is connected with the opening surface via the PIN diodes 1004 and 1005, and 1006 and 1007, and simultaneously powered by the waveguide. Here, the ½-wavelength linear antenna 1003 acts as a ½-wavelength dipole antenna, thereby generating radio waves having an electric field in a Y direction in this figure. ("Antenna Technology Handbook", edited by IEICE (Ohmsha, Ltd., 1999) and the like describe in detail about electromagnetic waves being emitted from the opened waveguide, and the ½-wavelength linear antenna.)

Further, a control voltage from the control part 1010 is applied to the PIN diodes 1004 and 1005, and 1006 and 1007 via the coil 1012. Depending on the polarity of the control voltage, the diodes turn into one of following states: (1) when positive voltages are applied the diodes 1004 and 1006 are ON, and when positive voltages are applied the diodes 1005 and 1007 are OFF (2) when negative voltages are applied the diodes 1004 and 1006 are OFF, and when negative voltages are applied the diodes 1005 and 1007 are ON, (3) all voltages are OFF, thereby controlling the electric fields which are generated by the waveguide antenna and the ½-wavelength linear antenna.

Initially, in the case (1), when the electric field that is generated by the waveguide antenna extends in the direction Z in this figure, the electric field that is generated by the ½-wavelength linear antenna extends in the direction Y in this figure. Consequently, an electric field that is obtained by combining the two electric fields is generated.

In the case (2), when the electric field that is generated by the waveguide antenna extends in the direction Z, the electric field that is generated by the ½-wavelength linear antenna extends in the direction of –(negative) Y. As a result, an electric field that is obtained by combining these two electric fields is generated.

In the case (3), the waveguide antenna is excited to generate an electric field in the direction Z in this figure, while the ½-wavelength linear antenna is not excited. Consequently, only an electric field in the direction Z is generated.

As described above, three electric fields having different polarized waves are generated from the antennas shown in FIG. 15. As the antennas are planarly constituted on the printed board 1008, three radio waves having the generated electric fields which are orthogonal to each other strongly electromagnetically couple with the metallic body of the information device to which the communication card is attached, and have different directions in which the metallic body is excited. Accordingly, the metallic body equivalently operates as three different antennas.

The metallic body of the information device which equivalently operates as these three different antennas can be equivalently switched by switching between dipole antennas to be excited.

When the antenna that is constructed as described above is employed, the printed board can be commonly used with other circuit components of the communication card. Accordingly, the communication card having the antenna matching means according to the present invention can be realized without increasing the costs.

Further, as the metallic body of the information device can be utilized equivalently as plural antennas having different polarized waves, and switching of the antennas can be performed, one of the antennas can be selected according to the state of thewaves, whereby an satisfactory communication can be realized in the communication card.

The communication cards according to the present invention have been described as the three embodiments on the basis of combinations of the variable matching unit and the antenna, while it goes without saying that the present invention is not limited to these three combinations and that the same effects as described above can be obtained even when the variable matching unit or the antenna is replaced between the respective embodiments.

INDUSTRIAL AVAILABILITY

In the communication card and the information device according to the present invention, part of the antenna protruding from the body of an information device is miniaturized and further the deterioration of the antenna characteristics is prevented, thereby preventing breakage of the antenna part and suppressing increases in manufacturing costs. Therefore, this communication card and the information device are quite useful as ones in which the portability of mobile products such as notebook personal computers and personal digital assistances (PDA) is realized.

The invention claimed is:

1. A communication card as a card-shaped communication device that is used being inserted into a card slot of an information device, said communication card including:

an antenna operable to receive or output communication waves; and an antenna matching means for establishing a conjugate match between an input impedance of said antenna and an output impedance of a matching circuit so as to have resistances which are equal to each other and reactances which have opposite signs but equal absolute values, said antenna being placed to be electromagnetically coupled with a metallic body which constitutes the information device, via an internal wall of the card slot, and said antenna matching means comprising:

a variable matching unit operable to vary a circuit parameter in accordance with a control signal;

a directional coupling unit operable to extract a reflected signal from said antenna;

a detection unit operable to detect an amplitude of the reflected signal that is extracted by said direction coupling unit; and a control unit operable to output the control signal to said variable matching unit on the basis of the amplitude of the reflected signal that is detected by said detection unit.

2. The communication card of claim 1, wherein said directional coupling unit includes:

two microstrip lines each having a length corresponding to a ¼ wavelength;

two coupling resistors; and one end resistor, wherein both ends of the two microstrip lines are connected with each other by the two coupling resistors, respectively, and wherein an end of one of the two microstrip lines and a grounding conductor are connected by the end resistor.

3. The communication card of claim 1,
wherein said variable matching unit includes:
plural capacitors and coils;
first switches for making effective an arbitrary capacitor and coil among said plural capacitors and coils; and
a first switch selector for controlling said first switches.

4. The communication card of claim 1,
wherein said variable matching unit includes one microstrip line, plural capacitors, first switches for making effective an arbitrary capacitor among the plural capacitors, and a first switch selector for controlling said first switches.

5. The communication card of claim 4,
wherein said plural capacitors included in said variable matching unit are connected to said microstrip line and a grounding conductor at predetermined intervals on said microstrip line, and
wherein said microstrip line is connected between an input terminal of said antenna and an input terminal of said variable matching unit.

6. The communication card of claim 1,
wherein said control unit carries out:
a first step of extracting the reflected signal from said antenna;
a second step of deciding the circuit parameter of said variable matching unit according to the amplitude of the reflected signal that is extracted in the first step; and
a third step of generating the control signal on the basis of the circuit parameter that is decided in the second step, repeatedly in this order.

7. The communication card of claim 6, wherein
in the second step,
one of a matching executing routine for executing matching of said antenna, and a matching monitoring routine for monitoring matching of said antenna is selected, and
the selected routine is executed so that, in the matching executing routine, random circuit parameters are generated to decide a circuit parameter at which the reflected signal from said antenna is minimized, and
in the matching monitoring routine, start of the conjugate match is decided when a deterioration degree of the conjugate match exceeds a threshold from viewpoints of a level and time.

8. The communication card of claim 1,
wherein the variable matching unit includes:
one microstrip line;
two varactor diodes;
two variable voltage devices generating voltages which are to be applied to said two varactor diodes;
two capacitors;
two coils; and
two resistors.

9. The communication card of claim 8,
wherein said capacitors, said coils, and said varactor diodes are connected in series between both ends of said microstrip line included in said variable matching unit, and grounding conductors, respectively, and
said resistors and said variable voltage devices are connected in series between connections of said coils and said varactor diodes which are connected in series, and grounding conductors, respectively.

10. The communication card of claim 1,
wherein said variable matching unit includes a variable phase shifter which can vary a phase amount of a signal that passes through the shifter itself.

11. The communication card of claim 10,
wherein assuming that said variable matching unit employs two of said variable phase shifters, and one of said variable phase shifters is a first variable phase shifter and the other is a second variable phase shifter,
said first variable phase shifter is connected between an input terminal of said antenna and an input terminal of said variable matching unit, and
said second variable phase shifter is connected between said input terminal of said variable matching unit and a grounding conductor.

12. The communication card of claim 11,
wherein said variable phase shifter is a voltage variable phase shifter in which passed phase amounts vary with voltages, and
includes a variable power supply that generates a voltage that is applied to said voltage variable phase shifter.

13. The communication card of claim 10,
wherein said variable phase shifter includes:
one hybrid coupler that uses a microstrip line; and
two varactor diodes.

14. The communication card of claim 1,
wherein plural antennas having different polarized waves are included as said antenna, and
wherein a selectively switching means is provided for selecting one of said plural antennas.

15. The communication card of claim 14, further including:
an antenna switch as said selectively switching means.

16. The communication card of claim 14,
wherein said plural antennas having different polarized waves are two rectangular loop antennas which employ lines of a printed board.

17. The communication card of claim 14,
wherein said plural antennas having different polarized waves are antennas which generate two elliptical polarized waves having opposite rotations.

18. The communication card of claim 14,
wherein said plural antennas having different polarized waves are two dipole antennas which are placed orthogonally with each other.

19. The communication card of claim 14,
wherein said plural antennas having different polarized waves includes:
lines of a printed board;
a folded conductor plate; and
a PIN diode switch.

20. The communication card of claim 14,
wherein said plural antennas having different polarized waves generate three electric fields having different polarized waves by controlling electric fields which are generated by a waveguide antenna and a ½-wavelength linear antenna.

21. The communication card of claim 14,
wherein said plural antennas having different polarized waves include:
a waveguide antenna that is constituted by lines of a printed board and a folded conductor plate; and
one linear antenna having a length corresponding to a ½ wavelength in the vicinity of an opening surface of said waveguide antenna,
wherein the linear antenna is placed so as to generate an electric field that is perpendicular to an electric field which is generated by said waveguide antenna, and
wherein an opening wall of the waveguide antenna and the linear antenna are connected via a switch.

22. The communication card of claim 14,
wherein an antenna switch button as said selectively switching means is provided on an end surface of said communication card, and
wherein one of said plural antennas having different polarized waves is selected when said switch button is pushed.

23. The communication card of claim 14,
wherein one of said plural antennas having different polarized waves is selected by software included in an information device that is capable of using said communication card.

24. An information device that is used being attached to a connector of an information device,
said information device including:
an antenna for receiving or outputting communication waves;
an antenna matching means for establishing a conjugate match between an input impedance of said antenna and an output impedance of a matching circuit so as to have resistances which are equal to each other and reactances which have opposite signs but equal absolute values,
said antenna being placed to be electromagnetically coupled with a metallic body which constitutes the information device, and
said antenna matching means comprising:
a variable matching unit operable to vary a circuit parameter in accordance with a control signal;
a directional coupling unit operable to extract a reflected signal from said antenna;
a detection unit operable to detect an amplitude of the reflected signal that is extracted by said direction coupling unit; and
a control unit operable to output the control signal to said variable matching unit on the basis of the amplitude of the reflected signal that is detected by said detection unit.

25. The communication card of claim 15,
wherein said plural antennas having different polarized waves include:
a waveguide antenna that is constituted by lines of a printed board and a folded conductor plate; and
one linear antenna having a length corresponding to a ½ wavelength in the vicinity of an opening surface of said waveguide antenna,
wherein said linear antenna is placed so as to generate an electric field that is perpendicular to an electric field which is generated by said waveguide antenna, and
wherein an opening wall of said waveguide antenna and said linear antenna are connected via a switch.

26. The communication card of claim 20,
wherein said plural antennas having different polarized waves include:
a waveguide antenna that is constituted by lines of a printed board and a folded conductor plate; and
one linear antenna having a length corresponding to a ½ wavelength in the vicinity of an opening surface of said waveguide antenna,
wherein said linear antenna is placed so as to generate an electric field that is perpendicular to an electric field which is generated by said waveguide antenna, and
wherein an opening wall of said waveguide antenna and said linear antenna are connected via a switch.

* * * * *